US009623450B2

(12) United States Patent
Nishiyama

(10) Patent No.: US 9,623,450 B2
(45) Date of Patent: Apr. 18, 2017

(54) SUBSTRATE CLEANING APPARATUS FOR CLEANING A LOWER SURFACE OF A SUBSTRATE

(71) Applicant: Koji Nishiyama, Kyoto (JP)

(72) Inventor: Koji Nishiyama, Kyoto (JP)

(73) Assignee: SCREEN Semiconductor Solutions Co., Ltd. (JP)

( * ) Notice: Subject to any disclaimer, the term of this patent is extended or adjusted under 35 U.S.C. 154(b) by 736 days.

(21) Appl. No.: 13/756,959

(22) Filed: Feb. 1, 2013

(65) Prior Publication Data

US 2013/0258300 A1    Oct. 3, 2013

(30) Foreign Application Priority Data

Mar. 27, 2012   (JP) ................................ 2012-072456

(51) Int. Cl.
*H01L 21/687*   (2006.01)
*H01L 21/02*    (2006.01)
*B08B 3/04*     (2006.01)
*H01L 21/67*    (2006.01)

(52) U.S. Cl.
CPC .......... *B08B 3/04* (2013.01); *H01L 21/67046* (2013.01); *H01L 21/67051* (2013.01); *H01L 21/68728* (2013.01)

(58) Field of Classification Search
CPC ......... H01L 21/67051; H01L 21/68728; H01L 21/6704; H01L 21/687; H01L 21/668714; H01L 21/68721; H01L 21/68735; H01L 21/68742; H01L 21/6875
See application file for complete search history.

(56) References Cited

U.S. PATENT DOCUMENTS

| 5,778,911 A | 7/1998 | Yoshio ........................ 134/104.2 |
| 8,015,985 B2 | 9/2011 | Hamada et al. .............. 134/99.1 |
| 8,166,985 B2 | 5/2012 | Nishiyama et al. .......... 134/137 |

(Continued)

FOREIGN PATENT DOCUMENTS

| JP | 8-108125 A | 4/1996 |
| JP | 10-223581 A | 8/1998 |

(Continued)

OTHER PUBLICATIONS

Taiwanese Office Action dated Mar. 13, 2015.
Notice of Reasons for Refusal dated Dec. 22, 2015 in the corresponding Japanese Patent Application No. 2012-072456.

*Primary Examiner* — Joseph L Perrin
*Assistant Examiner* — Irina Graf
(74) *Attorney, Agent, or Firm* — Ostrolenk Faber LLP

(57) ABSTRACT

A rotating shaft is provided to extend downward from the inside of a spin motor. A plate supporting member is attached to the lower end of the rotating shaft. A spin plate is supported in a horizontal attitude by the plate supporting member. A substrate holding mechanism is provided at the periphery on the spin plate. The lower end of an annular member is formed to be opposite to an annular region extending along the periphery on the upper surface of the substrate held by a spin chuck. A distance between the upper surface of the substrate and the lower surface of the spin plate is larger than a distance between the upper surface of the substrate and the lower end of the annular member.

9 Claims, 17 Drawing Sheets

(56) References Cited

U.S. PATENT DOCUMENTS

| | | | |
|---|---|---|---|
| 2004/0016452 A1* | 1/2004 | Kunisawa | H01L 21/6838 134/113 |
| 2009/0173364 A1 | 7/2009 | Hamada et al. | 134/30 |
| 2009/0253258 A1 | 10/2009 | Hara et al. | 438/597 |
| 2011/0030737 A1 | 2/2011 | Amano et al. | 134/32 |
| 2011/0265718 A1 | 11/2011 | Hara et al. | 118/699 |
| 2011/0290283 A1* | 12/2011 | Obweger | H01L 21/68785 134/104.2 |
| 2013/0059076 A1 | 3/2013 | Suzuki et al. | 427/240 |
| 2013/0160260 A1* | 6/2013 | Frank | H01L 21/67051 29/25.01 |

FOREIGN PATENT DOCUMENTS

| | | |
|---|---|---|
| JP | 11-204613 A | 7/1999 |
| JP | 2002-164314 A | 6/2002 |
| JP | 2006-156520 A | 6/2006 |
| JP | 2009-123800 | 6/2009 |
| JP | 2009-164370 | 7/2009 |
| JP | 2009-260033 | 11/2009 |
| JP | 2010-028060 A | 2/2010 |
| JP | 2011-54932 A | 3/2011 |
| TW | 200952110 A1 | 12/2009 |
| TW | 201205709 A1 | 2/2012 |

\* cited by examiner

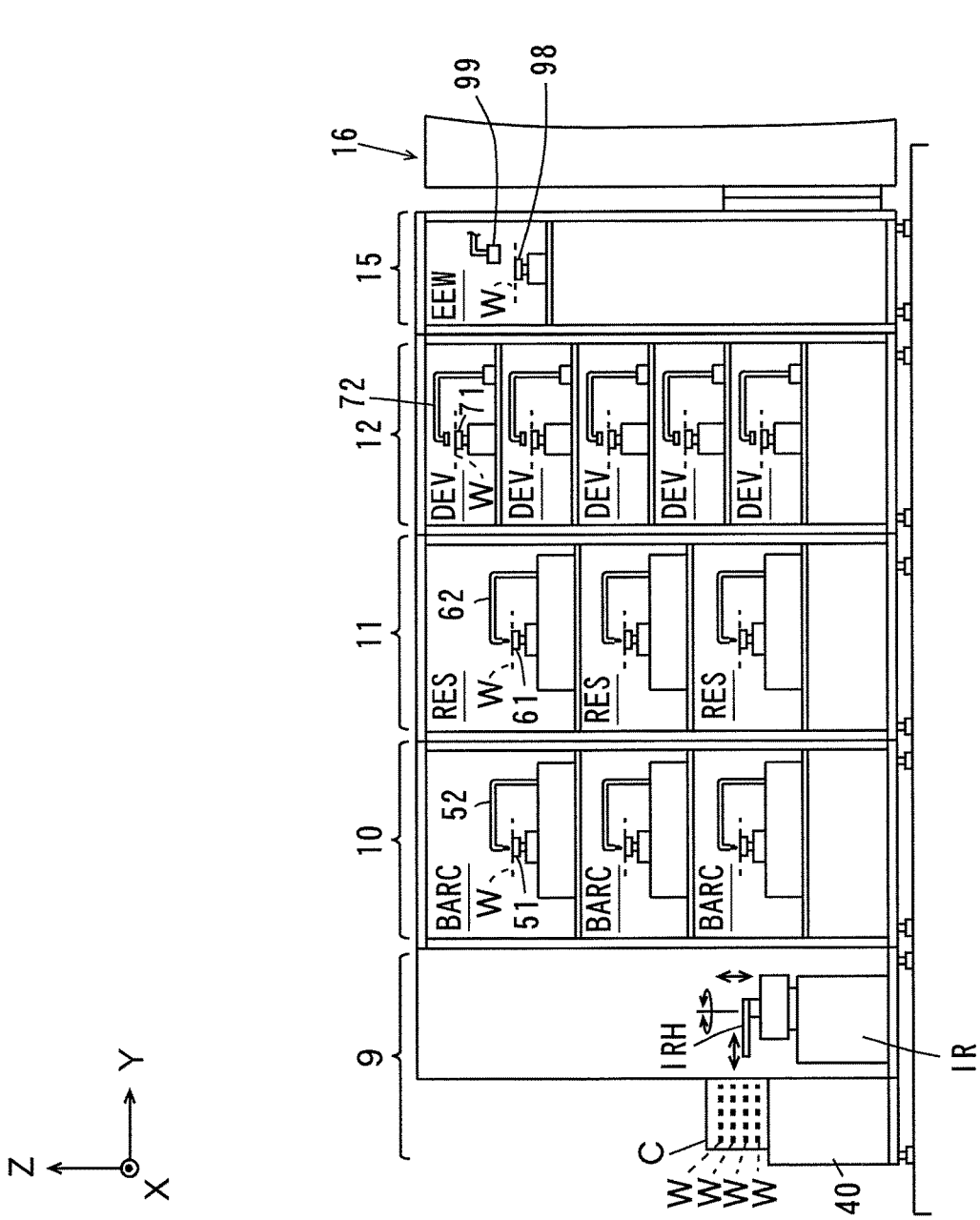
F I G. 2

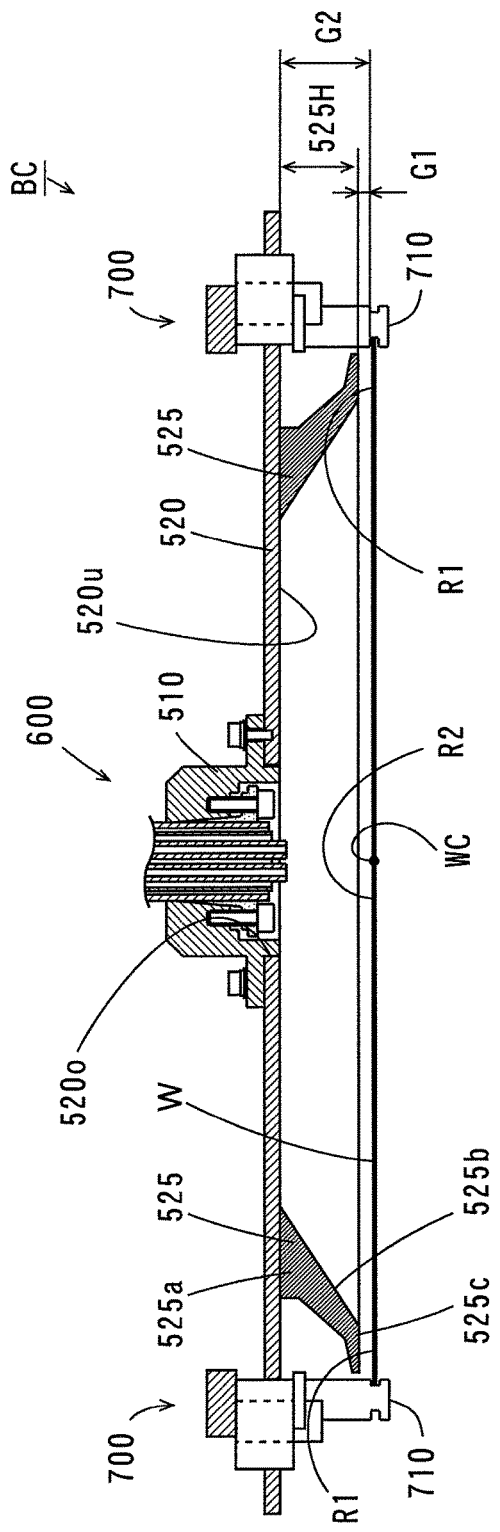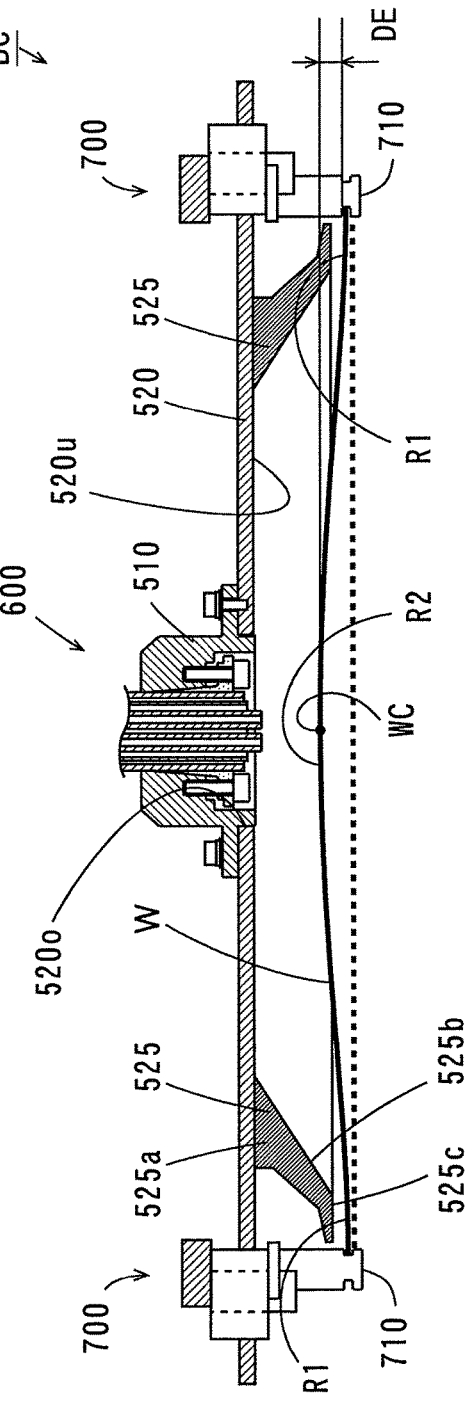

F I G. 1 1 (a)
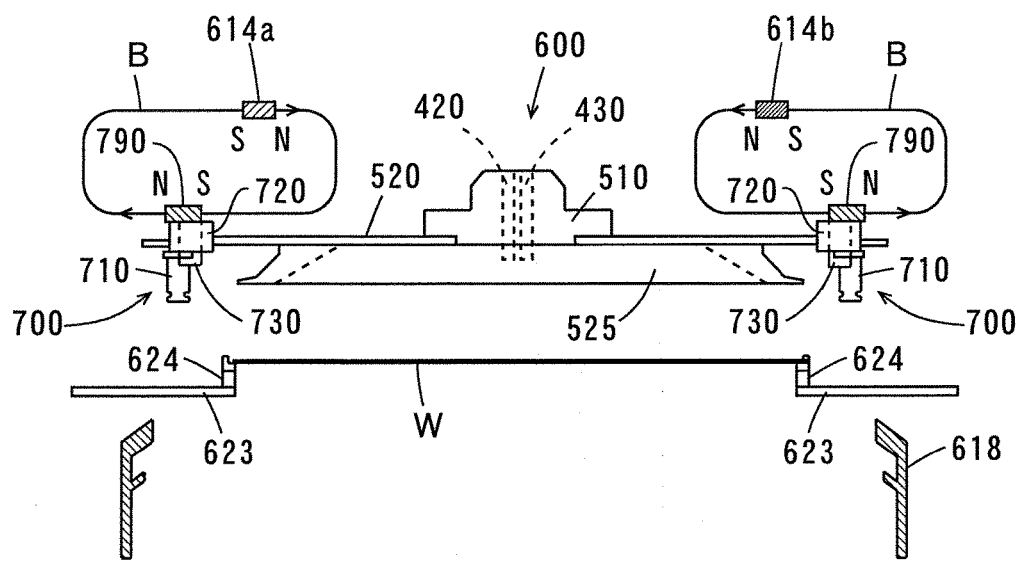
F I G. 1 1 (b)
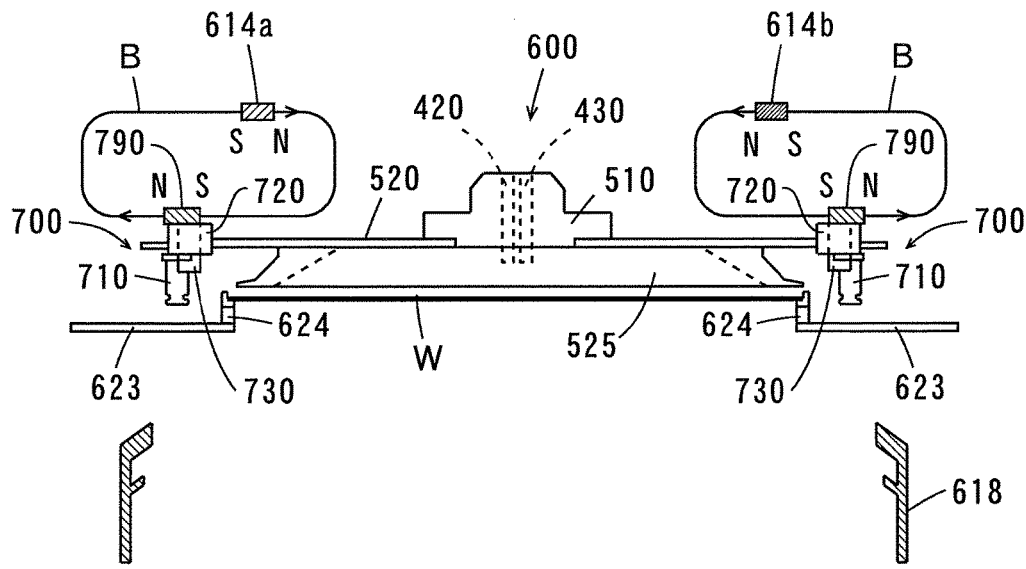

F I G. 1 7 (a)
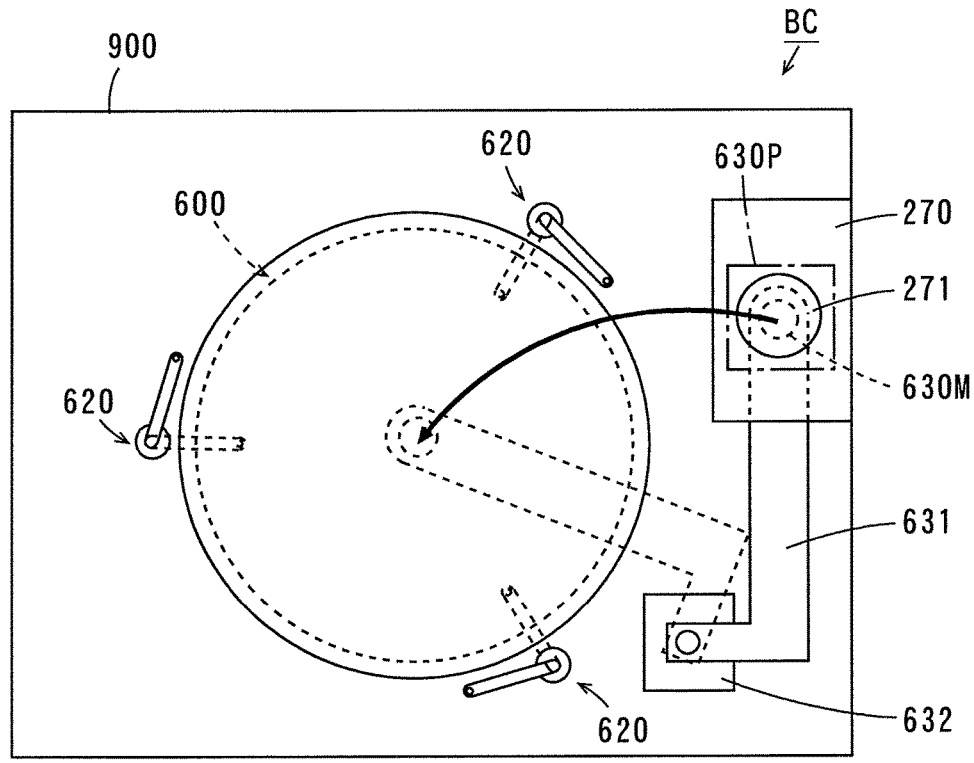
F I G. 1 7 (b)
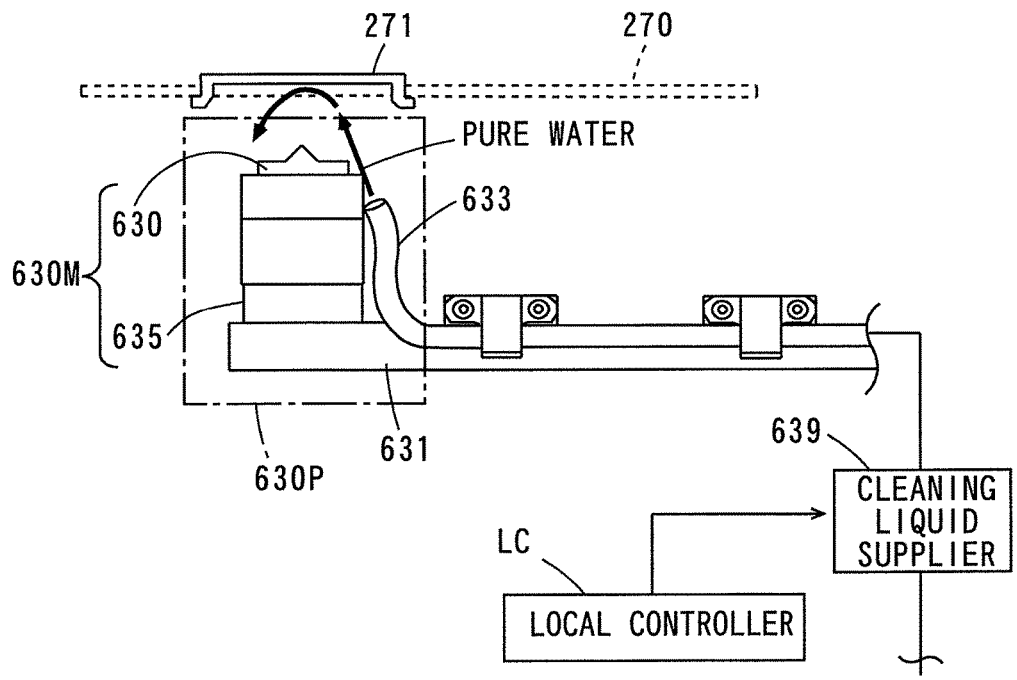

SUBSTRATE CLEANING APPARATUS FOR CLEANING A LOWER SURFACE OF A SUBSTRATE

BACKGROUND OF THE INVENTION (1) Field of the Invention

The present invention relates to a substrate cleaning apparatus and a substrate processing apparatus including the substrate cleaning apparatus.

(2) Description of Related Art

A substrate processing apparatus is used to apply a variety of processing to substrates such as semiconductor substrates, substrates for use in liquid crystal displays, plasma displays, optical discs, magnetic discs, magneto-optical discs, photomasks, and other substrates.

In the substrate processing apparatus, a substrate held by a spin chuck, for example, is subjected to cleaning processing. An example of the spin chuck includes an edge holding type spin chuck that holds the outer peripheral edge of the substrate (see, for example, JP 2009-260033 A).

The spin chuck described in JP 2009-260033 A is mainly composed of a spin motor, a rotating shaft, a spin plate, a shield plate and a plurality of holders.

The rotating shaft is provided to extend downward from the inside of the spin motor, and the disc-shaped spin plate is attached to the lower end of the rotating shaft. A disc-shaped shield plate is attached to the lower surface of the spin plate. The plurality of holders are attached to the periphery of the spin plate so as to extend downward from the spin plate. The upper surface of the substrate comes closer to the lower surface of the shield plate with the substrate being held by the plurality of holders. The spin plate rotates around a vertical axis, causing the substrate to rotate horizontally. In this state, the back surface of the substrate is cleaned by a brush or the like. After the completion of the back surface cleaning processing, the substrate rotates at high speed. Thus, cleaning liquid adhering to the substrate is shaken off, so that the substrate is dried.

BRIEF SUMMARY OF THE INVENTION

When the substrate rotates at high speed at the time of the back surface cleaning processing and the drying processing, an air flow from the center of the substrate towards the outer peripheral edge of the substrate is generated, and a negative pressure is developed in the space between the shield plate and the substrate. In this case, the substrate is deformed such that the center portion comes closer to the shield plate. If the distance between the shield plate and the substrate is small, however, the upper surface of the substrate may come in contact with the shield plate and damage to the substrate may occur. For the above reasons, the distance between the shield plate and the substrate cannot be small. However, if the distance between the shield plate and the substrate is large, a mist (microdroplets) of cleaning liquid generated at the time of the back surface cleaning processing and the drying processing, particles or the like that scatter in a processing chamber may adhere to the upper surface of the substrate.

An object of the present invention is to provide a substrate cleaning apparatus and a substrate processing apparatus that are capable of preventing damage to a substrate and cleaning a back surface of the substrate while keeping an upper surface of the substrate clean.

(1) According to an aspect of the present invention, a substrate cleaning apparatus that cleans a lower surface of a substrate includes a rotating member that is provided to be rotatable around a rotation axis extending in a vertical direction, a rotation-driving device that rotates the rotating member, a holding member that is configured to be rotatable together with the rotating member and holds the substrate by abutting against a periphery of the substrate at a position below the rotating member, a shield member that is provided at the rotating member so as to cover a space above an upper surface of the substrate held by the holding member and has an opening at a position in which the rotation axis is included, a fluid supply mechanism that supplies fluid through the opening to the upper surface of the substrate held by the holding member, and a cleaning mechanism that cleans the lower surface of the substrate held by the holding member, wherein the shield member has an opposite lower surface that is opposite to the upper surface of the substrate held by the holding member around the opening and an annular lower end that is formed around the opposite lower surface so as to be opposite to an annular region extending along a periphery in the upper surface of the substrate held by the holding member, and a distance between the upper surface of the substrate held by the holding member and the opposite lower surface is larger than a distance between the upper surface of the substrate held by the holding member and the lower end.

In the substrate cleaning apparatus, the holding member abuts against the outer peripheral edge of the substrate below the rotating member such that the substrate is held. The space above the upper surface of the substrate held by the holding member is covered by the shield member. The rotation-driving device rotates the rotating member, causing the substrate held by the holding member to rotate together with the rotating member. In this state, the fluid is supplied to the upper surface of the substrate through the opening of the shield member, and the lower surface of the substrate is cleaned by the cleaning mechanism.

In this case, a region inside of the annular region of the substrate is opposite to the opposite lower surface of the shield member and the annular region of the substrate is opposite to the lower end of the shield member. The substrate held by the holding member rotates, causing an atmosphere between the upper surface of the substrate held by the holding member and the shield member to flow out to a lateral space of the substrate through a gap between the lower end of the shield member and the upper surface of the substrate. Thus, a negative pressure is developed in the space above the upper surface of the substrate. As the rotation speed of the substrate held by the holding member becomes higher, the region inside of the annular region of the substrate is bent largely so as to come closer to the opposite lower surface of the shield member.

Even in this case, the distance between the upper surface of the substrate and the opposite lower surface of the shield member is larger than the distance between the upper surface of the substrate and the lower end of the shield member, and therefore the region inside of the annular region of the substrate does not come in contact with the opposite lower surface of the shield member. On the other hand, the holding member abuts against the outer peripheral edge of the substrate such that the substrate is held, and therefore the annular region of the substrate does not come in contact with the lower end of the shield member.

Further, the distance between the upper surface of the substrate and the lower end of the shield member is smaller than the distance between the upper surface of the substrate and the opposite lower surface of the shield member, and therefore an atmosphere including droplets of the cleaning liquid, particles or the like are prevented from flowing into the space above the upper surface of the substrate that is opposite to the opposite lower surface of the shield member from the gap between the upper surface of the substrate and the lower end of the shield member.

As a result, damage to the substrate caused by contact of the upper surface of the substrate with the shield member is prevented, and the lower surface of the substrate can be cleaned while the upper surface of the substrate is kept clean.

(2) The shield member may include a first member that is provided at the rotating member, and has the opposite lower surface and the opening and an annular second member that has the lower end, and the second member may be provided at the first member such that the lower end is positioned under the first member, and the holding member may be provided at the first member.

In this case, the holding member is provided at the first member of the shield member, and therefore it is not necessary to provide a separate configuration for rotating the holding member together with the rotating member. Thus, an increase in the number of the members in the substrate cleaning apparatus can be suppressed. Further, the shield member can be easily fabricated by providing the second member at the first member.

(3) The second member may further have an upper end that is attached to the first member, and an inner peripheral surface of the second member may be inclined such that an inner diameter gradually increases from the upper end towards the lower end.

In this case, the atmosphere between the upper surface of the substrate held by the holding member and the shield member flows along the opposite lower surface of the first member and the inner peripheral surface of the second member and is smoothly led to the gap between the lower end of the shield member and the upper surface of the substrate. As a result, turbulence is not generated on the upper surface of the substrate, and thus stability of the holding state of the substrate by the holding member is ensured and the upper surface of the substrate is prevented from being affected by the turbulence.

(4) The substrate cleaning apparatus may further include a supporting member that is attached to the rotating member to support the holding member, and the shield member may include a third member that is provided under the supporting member and, has the opposite lower surface and the opening, and an annular fourth member that has the lower end, and the fourth member may be provided at the third member such that the lower end is positioned under the third member.

In this case, the holding member is supported by the supporting member, and the third member is provided under the supporting member. Therefore, the distance between the upper surface of the substrate held by the holding member and the opposite lower surface of the third member can be made smaller than the distance between the upper surface of the substrate and the supporting member. Further, the shield member can be easily fabricated by providing the fourth member at the third member.

(5) The fourth member may further include an upper end attached to the third member, and an inner peripheral surface of the fourth member may be inclined such that an inner diameter gradually increases from the upper end towards the lower end.

In this case, the atmosphere between the upper surface of the substrate held by the holding member and the shield member flows along the opposite lower surface of the third member and the inner peripheral surface of the fourth member and is smoothly led to the gap between the lower end of the shield member and the upper surface of the substrate. As a result, the turbulence is not generated on the upper surface of the substrate, and therefore the stability of the holding state of the substrate by the holding member is ensured and the upper surface of the substrate is prevented from being affected by the turbulence.

(6) The cleaning mechanism may include a brush that cleans the lower surface of the substrate held by the holding member, and a projection abuttable against the lower surface of the substrate may be formed on the brush, and a horizontal cross sectional area of the projection may reduce gradually towards an upper end of the brush.

In this case, the horizontal cross sectional area of the projection reduces gradually towards the upper end, and therefore, when the projection abuts against the lower surface of the substrate, a contact area between the brush and the substrate can be made smaller than when a brush without the projection is pressed against the lower surface of the substrate.

Therefore, the pressure to be exerted on the lower surface of the substrate by the brush can be made smaller. As a result, the substrate is prevented from shifting or deforming in cleaning of the lower surface of the substrate.

Further, because the contact area between the brush and the substrate can be made smaller, the number of particles that adhere to the brush can be reduced in cleaning of the lower surface of the substrate. Thus, the number of the particles to be transferred from the brush to the substrate can be reduced.

Furthermore, because the contact area between the brush and the substrate can be made smaller, the frictional force exerted between the brush and the substrate can be made smaller in cleaning of the lower surface of the substrate. Thus, the substrate held by the holding member is prevented from shifting against the holding force.

(7) The cleaning mechanism may include a cleaning liquid discharge nozzle that discharges cleaning liquid from below towards the lower surface of the substrate held by the holding member, and the substrate cleaning apparatus may further include a cleaning mechanism moving device that moves the cleaning mechanism between a position that is opposite to the lower surface of the substrate and a predetermined waiting position that is not opposite to the lower surface of the substrate, and a liquid receiving member that is provided over the waiting position and configured to receive the cleaning liquid discharged from the cleaning liquid discharge nozzle of the cleaning mechanism when the cleaning mechanism is at the waiting position.

In this case, after the cleaning mechanism moving device moves the cleaning mechanism from the waiting position to the position opposite to the lower surface of the substrate, cleaning of the lower surface of the substrate is started. Further, after the cleaning of the lower surface of the substrate is finished, the cleaning mechanism moving device moves the cleaning mechanism from the position opposite to the lower surface of the substrate to the waiting position.

While the cleaning of the lower surface of the substrate is not being performed, the cleaning liquid that has been used for the previous cleaning remains inside of the cleaning liquid discharge nozzle. Even in this case, because the liquid receiving member is provided over the waiting position, the cleaning liquid can be discharged from the cleaning liquid discharge nozzle with the cleaning mechanism being in the waiting position. The cleaning liquid is discharged from the cleaning liquid discharge nozzle, so that remaining cleaning liquid inside of the cleaning liquid discharge nozzle is replaced with a new cleaning liquid. As a result, generation of bacteria inside of the cleaning liquid discharge nozzle is prevented.

(8) According to another aspect of the present invention, a substrate processing apparatus that is arranged adjacent to an exposure device and performs processing on a substrate includes a processing section for performing the processing on the substrate, and an interface section for receiving and transferring the substrate between the processing section and the exposure device, wherein at least one of the processing section and the interface section includes the substrate cleaning apparatus that cleans the lower surface of the substrate.

In the substrate processing apparatus, the processing section performs predetermined processing on the substrate, and the interface section receives and transfers the substrate between the processing section and the exposure device. At least one of the processing section and the interface section includes the above mentioned substrate cleaning apparatus.

In the substrate cleaning apparatus, damage to the substrate caused by contact of the upper surface of the substrate with the shield member can be prevented, and the lower surface of the substrate can be cleaned while the upper surface of the substrate is kept clean. Therefore, the damage to the substrate can be prevented, and a processing defect of the substrate due to contamination on the upper surface and the lower surface can be prevented.

(9) The processing section may include a photosensitive film formation unit configured to form a photosensitive film made of a photosensitive material on an upper surface of the substrate, and the substrate cleaning apparatus may be configured to clean the lower surface of the substrate after the formation of the photosensitive film by the photosensitive film formation unit and before or after the exposure processing by the exposure device.

In this case, the lower surface of the substrate after the formation of the photosensitive film by the photosensitive film formation unit and before or after the exposure processing by the exposure device is cleaned by the substrate cleaning apparatus. The upper surface of the substrate is prevented from coming in contact with the shield member in cleaning of the substrate by the substrate cleaning apparatus and the upper surface of the substrate is kept clean. Thus, the deformation and the contamination of the photosensitive film formed on the upper surface of the substrate is prevented.

Other features, elements, characteristics, and advantages of the present invention will become more apparent from the following description of preferred embodiments of the present invention with reference to the attached drawings.

BRIEF DESCRIPTION OF THE SEVERAL VIEWS OF THE DRAWING

FIG. 2 is a schematic side view of one side of the substrate processing apparatus of FIG. 1;

FIGS. 7(a) and 7(b) are vertical cross sectional views showing one example of a spin chuck;

FIGS. 11(a) and 11(b) are diagrams for explaining the holding operation of the substrate by the spin chuck;

FIG. 17(a) is a schematic plan view of the inside of a casing mainly showing the spin chuck and a cleaning mechanism; and FIG. 17(b) is a side view for explaining the operation of a cleaning mechanism cover of FIG. 5.

DESCRIPTION OF THE PREFERRED EMBODIMENTS

A substrate cleaning apparatus and a substrate processing apparatus including the substrate cleaning apparatus according to an embodiment of the present invention will be described with reference to the drawings. In the following description, a substrate refers to a semiconductor substrate, a substrate for a liquid crystal display, a substrate for a plasma display, a glass substrate for a photomask, a substrate for an optical disk, a substrate for a magnetic disk, a substrate for a magneto-optical disk, a substrate for a photomask and the like. In the present embodiment, a back surface cleaning processing unit that performs cleaning processing on a back surface of the substrate before exposure processing will be described as one example of the substrate cleaning apparatus.

(1) Configuration of Substrate Processing Apparatus

Figure 1:
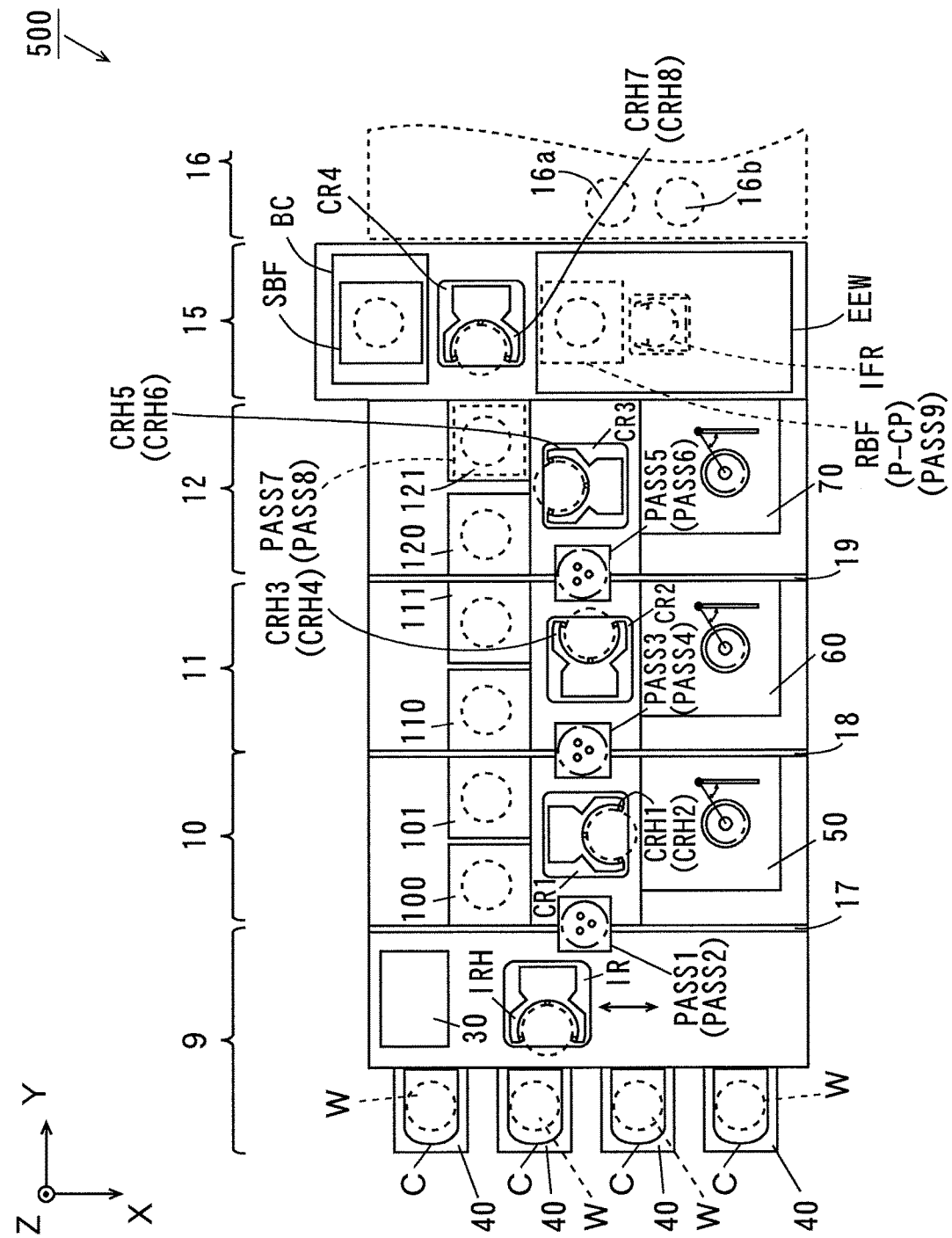
FIG. 1 is a plan view of a substrate processing apparatus according to one embodiment of the present invention.

FIG. 1 is a plan view of a substrate processing apparatus according to one embodiment of the present invention. FIG. 1 and FIGS. 2 to 4 described below are accompanied by the arrows that indicate X, Y, and Z directions orthogonal to one another for the clarity of a positional relationship. The X and Y directions are orthogonal to each other within a horizontal plane and the Z direction corresponds to a vertical direction.

As shown in FIG. 1, the substrate processing apparatus 500 includes an indexer block 9, an anti-reflection film processing block 10, a resist film processing block 11, a development processing block 12 and an interface block 15. An exposure device 16 is arranged adjacent to the interface block 15. The exposure device 16 subjects a substrate W to the exposure processing.

The indexer block 9 includes a main controller (controller) 30, a plurality of carrier platforms 40, and an indexer robot IR. The main controller 30 controls the operations of the indexer block 9, the anti-reflection film processing block 10, the resist film processing block 11, the development processing block 12 and the interface block 15. The indexer robot IR has a hand IRH provided for receiving and transferring the substrate W.

The anti-reflection film processing block 10 includes thermal processing sections 100, 101 for anti-reflection film, a coating processing section 50 for anti-reflection film, and a first central robot CR1. The coating processing section 50 is opposite to the thermal processing sections 100, 101 with the first central robot CR1 sandwiched therebetween. The first central robot CR1 has hands CRH1, CRH2 provided one above the other for receiving and transferring the substrate W.

A partition wall 17 for shielding an atmosphere is provided between the indexer block 9 and the anti-reflection film processing block 10. The partition wall 17 has substrate platforms PASS1, PASS2 provided in the vicinity of one above the other for receiving and transferring the substrate W between the indexer block 9 and the anti-reflection film processing block 10. The upper substrate platform PASS1 is used in transporting the substrate W from the indexer block 9 to the anti-reflection film processing block 10, and the lower substrate platform PASS2 is used in transporting the substrate W from the anti-reflection film processing block 10 to the indexer block 9.

Each of the substrate platforms PASS1, PASS2 is provided with an optical sensor (not shown) that detects the presence or absence of the substrate W. This allows determination whether or not the substrate W is placed on the substrate platforms PASS1, PASS2. Furthermore, each of the substrate platforms PASS1, PASS2 has a plurality of support pins secured thereto. Note that each of substrate platforms PASS3 to PASS9 described below is similarly provided with the optical sensor and the support pins.

The resist film processing block 11 includes thermal processing sections 110, 111 for resist film, a coating processing section 60 for resist film, and a second central robot CR2. The coating processing section 60 is opposite to the thermal processing sections 110, 111 with the second central robot CR2 sandwiched therebetween. The second central robot CR2 has hands CRH3, CRH4 provided one above the other for receiving and transferring the substrate W.

A partition wall 18 for shielding an atmosphere is provided between the anti-reflection film processing block 10 and the resist film processing block 11. The partition wall 18 has substrate platforms PASS3, PASS4 provided in the vicinity of one above the other for receiving and transferring the substrate W between the anti-reflection film processing block 10 and the resist film processing block 11. The upper substrate platform PASS3 is used in transporting the substrate W from the anti-reflection film processing block 10 to the resist film processing block 11, and the lower substrate platform PASS4 is used in transporting the substrate W from the resist film processing block 11 to the anti-reflection film processing block 10.

The development processing block 12 includes a thermal processing section 120 for development, a thermal processing section 121 for post-exposure bake, a development processing section 70 and a third central robot CR3. The thermal processing section 121, adjacent to the interface block 15, has substrate platforms PASS7, PASS8 as described below. The development processing section 70 is opposite to the thermal processing section 120 and the thermal processing section 121 with the third central robot CR3 sandwiched therebetween. The third central robot CR3 has hands CRH5, CRH6 provided one above the other for receiving and transferring the substrate W.

A partition wall 19 for shielding an atmosphere is provided between the resist film processing block 11 and the development processing block 12. The partition wall 19 has substrate platforms PASS5, PASS6 provided in the vicinity of one above the other for receiving and transferring the substrate W between the resist film processing block 11 and the development processing block 12. The upper substrate platform PASS5 is used in transporting the substrates W from the resist film processing block 11 to the development processing block 12, and the lower substrate platform PASS6 is used in transporting the substrate W from the development processing block 12 to the resist film processing block 11.

The interface block 15 includes a sending buffer unit SBF, back surface cleaning processing units BC, a fourth central robot CR4, an edge exposure unit EEW, a return buffer unit RBF, placement/cooling units PASS-CP (hereinafter abbreviated as P-CP), a substrate platform PASS9 and an interface transport mechanism IFR.

Each back surface cleaning processing unit BC subjects the back surface of the substrate W before the exposure processing to cleaning processing (hereinafter referred to as back surface cleaning processing). According to the back surface cleaning processing unit BC, damage to the substrate W is prevented and the lower surface of the substrate W can be cleaned while the upper surface of the substrate W is kept clean. The details of the back surface cleaning processing unit BC will be described below.

Here, the surface of the substrate W directed upward is referred to as an upper surface of the substrate W, and the surface of the substrate directed downward is referred to as a lower surface of the substrate W. Note that a main surface of the substrate W refers to a surface, on which an anti-reflection film and a resist film are formed in the anti-reflection film processing block 10 and the resist film processing block 11, and the back surface of the substrate W refers to a surface on the opposite side thereof. Inside of the substrate processing apparatus 500 according to the present embodiment, the substrate W is subjected to various processing with the main surface thereof directed upward.

The fourth central robot CR4 has hands CRH7, CRH8 (FIG. 4) provided one above the other for receiving and transferring the substrate W and the interface transport mechanism IFR has hands H1, H2 (FIG. 4) provided one above the other for receiving and transferring the substrate W. The details of the interface block 15 will be described below.

In the substrate processing apparatus 500 according to the present embodiment, the indexer block 9, the anti-reflection film processing block 10, the resist film processing block 11, the development processing block 12 and the interface block 15 are arranged in this order in the Y direction.

Figure 3:
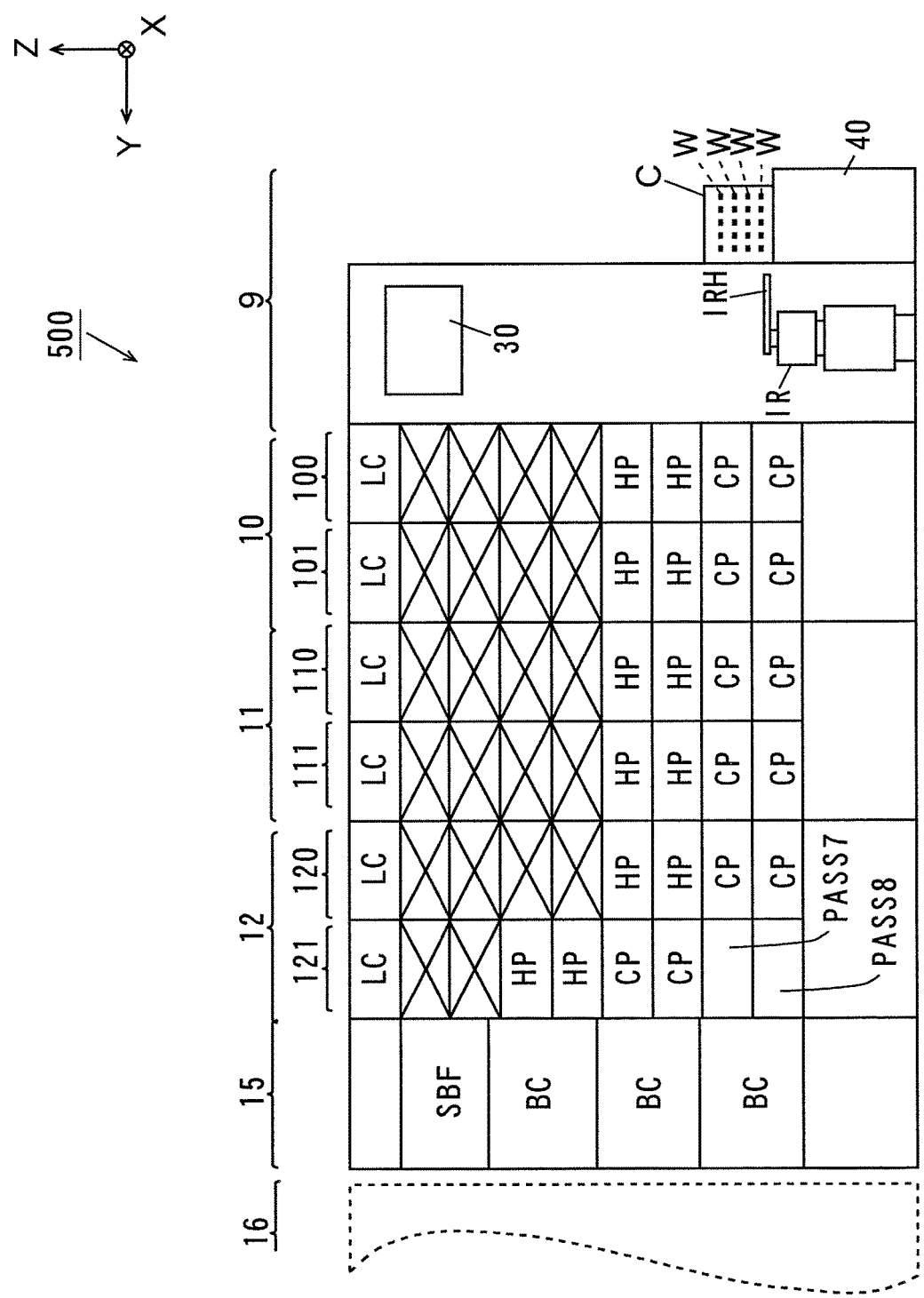
FIG. 3 is a schematic side view of the other side of the substrate processing apparatus of FIG. 1.

FIG. 2 is a schematic side view of one side of the substrate processing apparatus 500 of FIG. 1, and FIG. 3 is a schematic side view of the other side of the substrate processing apparatus 500 of FIG. 1. FIG. 2 mainly shows the configuration provided on the one side of the substrate processing apparatus 500, and FIG. 3 mainly shows the configuration provided on the other side of the substrate processing apparatus 500.

First, the configuration of the substrate processing apparatus 500 will be described using FIG. 2. As shown in FIG. 2, the coating processing section 50 in the anti-reflection film processing block 10 (FIG. 1) has a vertical stack of three coating units BARC. Each coating unit BARC includes a spin chuck 51 that rotates while holding the substrate W in a horizontal attitude by suction, and a supply nozzle 52 that supplies coating liquid for an anti-reflection film to the substrate W held on the spin chuck 51.

The coating processing section 60 in the resist film processing block 11 (FIG. 1) has a vertical stack of three coating units RES. Each coating unit RES includes a spin chuck 61 that rotates while holding the substrate W in a horizontal attitude by suction, and a supply nozzle 62 that supplies coating liquid for a resist film to the substrate W held on the spin chuck 61.

The development processing section 70 in the development processing block 12 (FIG. 1) has a vertical stack of five development processing units DEV. Each development processing unit DEV includes a spin chuck 71 that rotates while holding the substrate W in a horizontal attitude by suction, and a supply nozzle 72 that supplies development liquid to the substrate W held on the spin chuck 71.

The interface block 15 has the edge exposure unit EEW arranged on the one side. The edge exposure unit EEW includes a spin chuck 98 that rotates while holding the substrate in a horizontal attitude by suction, and a light irradiator 99 that exposes a periphery of the substrate W held on the spin chuck 98.

Next, the configuration of the substrate processing apparatus 500 will be described using FIG. 3. As shown in FIG. 3, each of the thermal processing sections 100, 101 in the anti-reflection film processing block 10 has the vertical stack of two heating units (hot plates) HP and two cooling units (cooling plates) CP. Each of the thermal processing sections 100, 101 has a local controller LC that is arranged in its uppermost part controls the respective temperatures of the heating units HP and the cooling units CP.

Each of the thermal processing sections 110, 111 in the resist film processing block 11 has the vertical stack of the two heating units HP and the two cooling units CP. Each of the thermal processing sections 110, 111 also has the local controller LC that is arranged in its uppermost part controls the respective temperatures of the heating units HP and the cooling units CP.

The thermal processing section 120 in the development processing block 12 has the vertical stack of the two heating units HP and the two cooling units CP, and the thermal processing section 121 has the vertical stack of the two heating units HP, the two cooling units CP and the substrate platforms PASS7, PASS8. Each of the thermal processing section 120 and the thermal processing section 121 has the local controller LC that is arranged its uppermost part controls the respective temperatures of the heating units HP and the cooling units CP.

Figure 4:
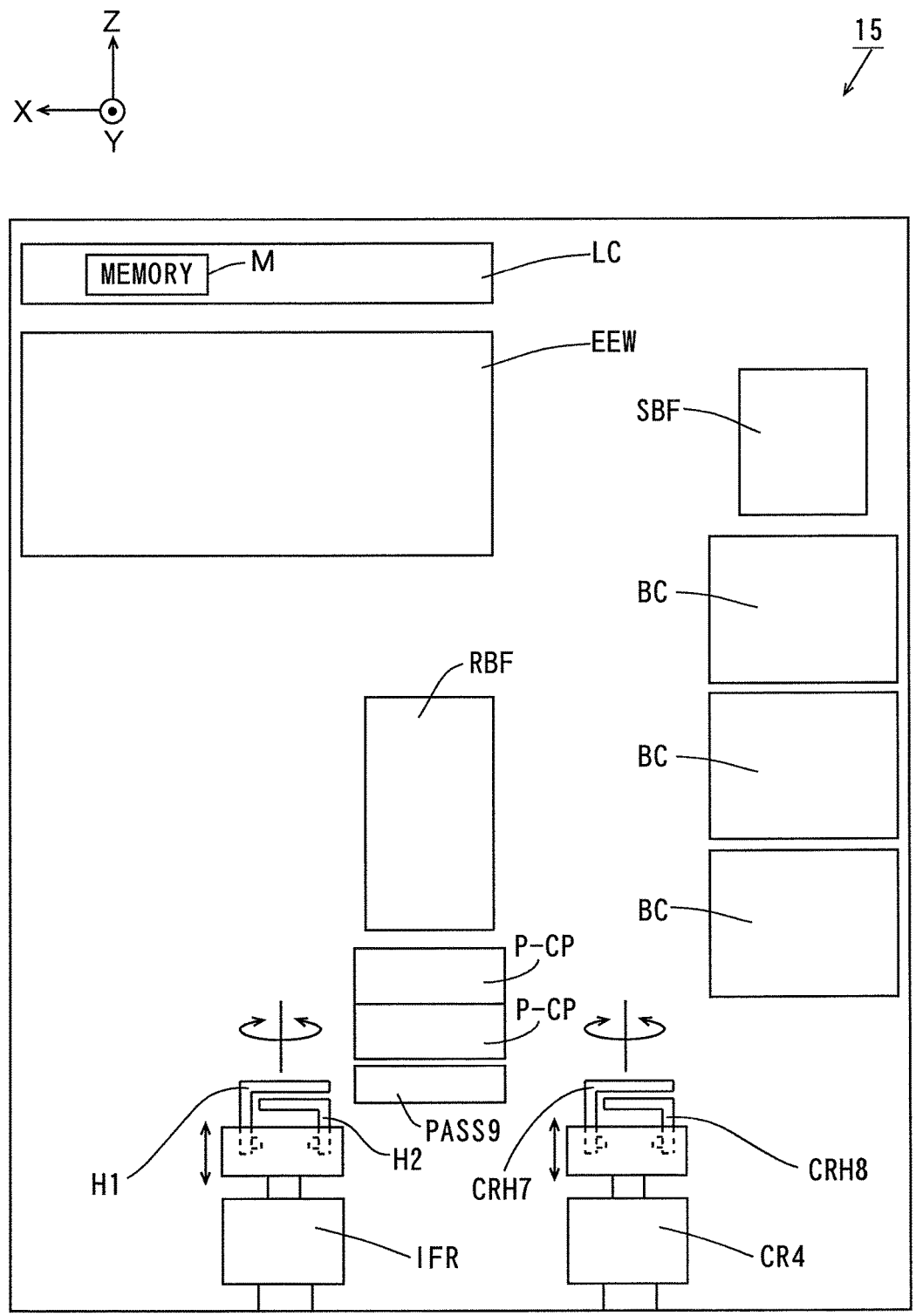
FIG. 4 is a schematic side view of an interface block viewed from an exposure device of FIG. 1.

The interface block 15 will be then described in detail using FIG. 4. FIG. 4 is a schematic side view of the interface block 15 as viewed from the exposure device 16 of FIG. 1. As shown in FIG. 4, the interface block 15 has the vertical stack of the sending buffer unit SBF and the three back surface cleaning processing units BC on the one side. The interface block 15 has the edge exposure unit EEW arranged on the other side in its upper part. A local controller LC that mainly controls the operations of the back surface cleaning processing units BC, the edge exposure unit EEW, the fourth central robot CR4 and the interface transport mechanism IFR is arranged over the edge exposure unit EEW. The local controller LC includes a memory M. The memory M stores the information for controlling the operations of each constituent element provided in the interface block 15.

The interface block 15 has the vertical stack of the return buffer unit RBF, two placement/cooling units P-CP, and a substrate platform PASS9 at its substantially central portion below the edge exposure unit EEW.

The fourth central robot CR4 and the interface transport mechanism IFR are provided in the lower portion of the interface block 15. The fourth central robot CR4 is provided to be vertically movable and rotatable in an area among the sending buffer unit SBF, the back surface cleaning processing units BC, the edge exposure unit EEW, the return buffer unit RBF, the placement/cooling units P-CP, and the substrate platform PASS9. The interface transport mechanism IFR is provided to be vertically movable and rotatable in an area among the return buffer unit RBF, the placement/cooling units P-CP and the substrate platform PASS9.

(2) Operation of Substrate Processing Apparatus

The operation of the substrate processing apparatus 500 according to the present embodiment will be then described with reference to FIGS. 1 to 4.

(2-1) Operations from Indexer Block to Development Processing Block

First, the operations from the indexer block 9 to the development processing block 12 will be briefly described.

Carriers C that store a plurality of substrates W in multiple stages are carried onto the carrier platforms 40 in the indexer block 9. The indexer robot IR takes out any one of the unprocessed substrates W that is stored in any one of the carriers C using the hand IRH. Thereafter, the indexer robot IR rotates around the shaft parallel with the Z direction while moving in the X direction, to place the unprocessed substrate W on the substrate platform PASS1.

The unprocessed substrate W placed on the substrate platform PASS1 is received by the first central robot CR1 in the anti-reflection film processing block 10. The first central robot CR1 carries the substrate W into the thermal processing section 100, 101.

Thereafter, the first central robot CR1 takes out the thermally processed substrate W from the thermal processing section 100, 101 and carries the substrate W into the coating processing section 50. In the coating processing section 50, one of the coating units BARC forms a coating of an anti-reflection film on the substrate W in order to reduce a standing wave and halation to be generated during the exposure processing.

The first central robot CR1 takes out the substrate W after the coating processing from the coating processing section 50 and carries the substrate W into the thermal processing section 100, 101. Thereafter, the first central robot CR1 takes out the thermally processed substrate W from the thermal processing section 100, 101 and places the substrate W on the substrate platform PASS3.

The substrate W placed on the substrate platform PASS3 is received by the second central robot CR2 in the resist film processing block 11. The second central robot CR2 carries the substrate W into the thermal processing section 110, 111.

Thereafter, the second central robot CR2 takes out the thermally processed substrate W from the thermal processing section 110, 111 and carries the substrate W into the coating processing section 60. In the coating processing section 60, any one of the coating units RES forms a coating of the resist film on the substrate W that has been coated with the anti-reflection film.

The second central robot CR2 takes out the substrate W after coating processing from the coating processing section 60 and carries the substrate W into the thermal processing section 110, 111. Thereafter, the second central robot CR2 takes out the thermally processed substrate W from the thermal processing section 110, 111 and places the substrate W on the substrate platform PASS5.

The substrate W placed on the substrate platform PASS5 is received by the third central robot CR3 in the development processing block 12. The third central robot CR3 places the substrate W on the substrate platform PASS7.

The substrate W placed on the substrate platform PASS7 is received by the fourth central robot CR4 in the interface block 15 and is subjected to predetermined processing in the interface block 15 and the exposure device 16, as described below. After the predetermined processing is performed in the interface block 15 and the exposure device 16, the fourth central robot CR4 carries the substrate W into the thermal processing section 121 in the development processing block 12.

In the thermal processing section 121, the substrate W is subjected to a post-exposure bake (PEB). Thereafter, the fourth central robot CR4 takes out the substrate W from the thermal processing section 121 and places the substrate W on the substrate platform PASS8.

The substrate W placed on the substrate platform PASS8 is received by the third central robot CR3 in the development processing block 12. The third central robot CR3 carries the substrate W into the development processing section 70. In the development processing section 70, the exposed substrate W is subjected to development processing.

The third central robot CR3 then takes out the substrate W after the development processing from the development processing section 70 and carries the substrate W into the thermal processing section 120. Thereafter, the third central robot CR3 takes out the thermally processed substrate W from the thermal processing section 120 and places the substrate W on the substrate platform PASS6.

The substrate W placed on the substrate platform PASS6 is placed on the substrate platform PASS4 by the second central robot CR2 in the resist film processing block 11. The substrate W placed on the substrate platform PASS4 is placed on the substrate platform PASS2 by the first central robot CR1 in the anti-reflection film processing block 10.

The substrate W placed on the substrate platform PASS2 is stored in the carrier C by the indexer robot IR in the indexer block 9. Each processing for the substrate W in the substrate processing apparatus 500 is thus terminated.

(2-2) Operation of Interface Block

The operation of the interface block 15 will be then described.

As described above, the substrate W carried into the indexer block 9 is subjected to predetermined processing and is then placed on the substrate platform PASS7 in the development processing block 12 (FIG. 1).

The substrate W placed on the substrate platform PASS7 is received by the fourth central robot CR4 in the interface block 15. The fourth central robot CR4 carries the substrate W into the edge exposure unit EEW (FIG. 4). In the edge exposure unit EEW, a periphery of the substrate W is subjected to the exposure processing.

The fourth central robot CR4 then takes out the substrate W after the exposure processing from the edge exposure unit EEW and carries the substrate W into any one of the back surface cleaning processing units BC. As described above, in the back surface cleaning processing unit BC, the substrate W before the exposure processing is subjected to the back surface cleaning processing.

A time period for the exposure processing by the exposure device 16 is normally longer than the time period for another processing step and transporting step. As a result, the exposure device 16 cannot accept the subsequent substrates W in many cases. In this case, the substrate W is temporarily stored in the sending buffer unit SBF (FIG. 4). In the present embodiment, the fourth central robot CR4 takes out the substrate W after the back surface cleaning processing from the back surface cleaning processing unit BC and transports the substrate W to the sending buffer unit SBF.

The fourth central robot CR4 then takes out the substrate W stored in the sending buffer unit SBF and carries the substrate W into any one of the placement/cooling units P-CP. The substrate W carried into any one of the placement/cooling units P-CP is kept at the same temperature (23° C., for example) as the temperature in the exposure device 16.

In the case where the exposure device 16 has sufficient processing speed, the substrate W does not have to be stored in the sending buffer unit SBF, but may be transported to the placement/cooling unit P-CP from the back surface cleaning processing unit BC.

The substrate W kept at the above mentioned predetermined temperature in the placement/cooling unit P-CP is then received by the upper hand H1 of the interface transport mechanism IFR (FIG. 4) and carried into a substrate inlet 16a in the exposure device 16 (FIG. 1).

The substrate W that has been subjected to the exposure processing in the exposure device 16 is carried out of a substrate outlet 16b (FIG. 1) by the interface transport mechanism IFR. The interface transport mechanism IFR places the substrate W on the substrate platform PASS9.

The substrate W placed on the substrate platform PASS9 is received by the fourth central robot CR4. The fourth central robot CR4 carries the substrate W into the thermal processing section 121 in the development processing block 12 (FIG. 1).

Note that when the development processing block 12 cannot temporarily receive the substrate W due to a failure or the like in the development processing unit DEV (FIG. 2), the substrate W after the exposure processing can be temporarily stored in the return buffer unit RBF.

(3) Back Surface Cleaning Processing Unit

Figure 5:
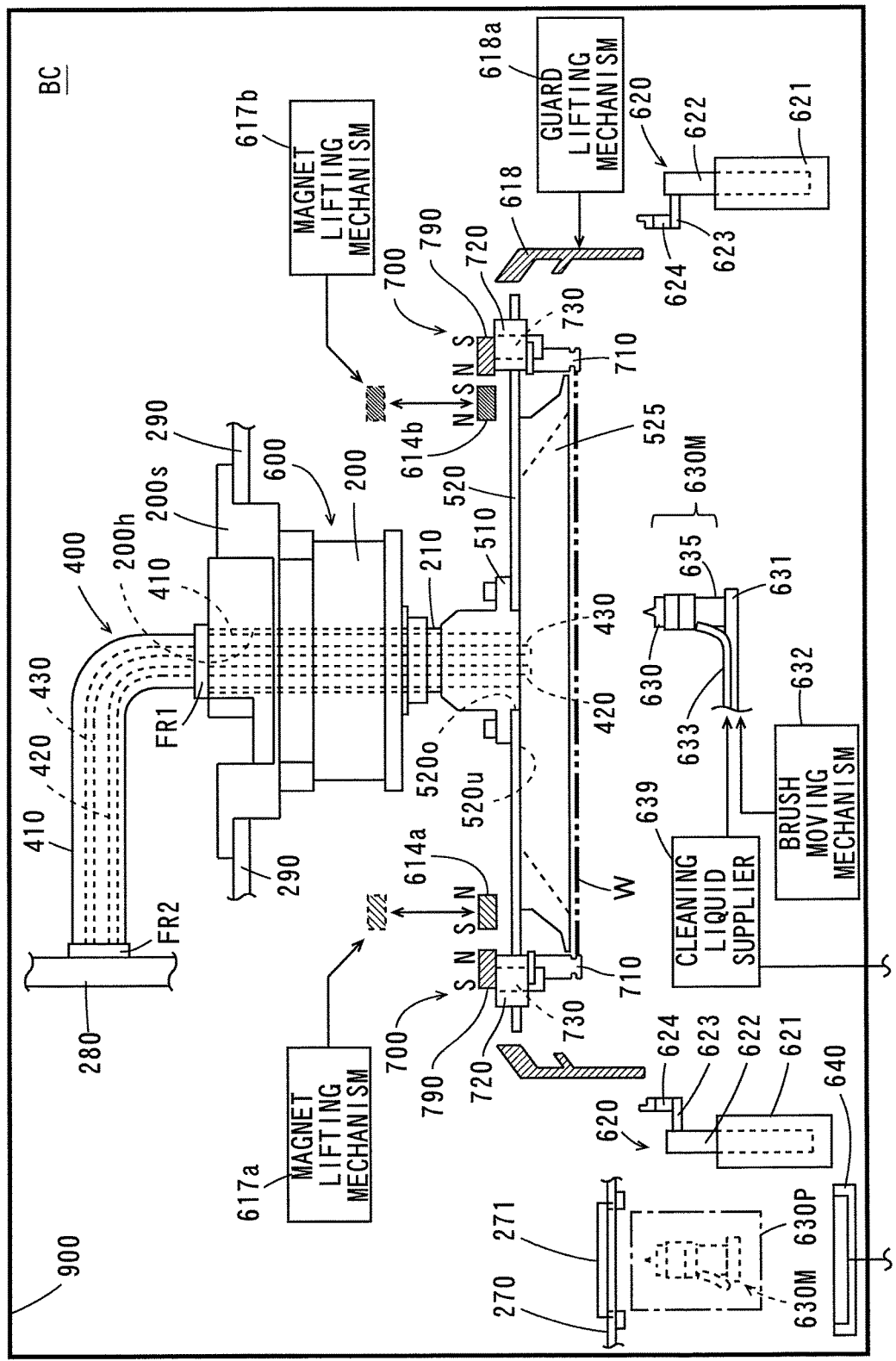
FIG. 5 is a side view showing the configuration of a back surface cleaning processing unit.
Figure 6:
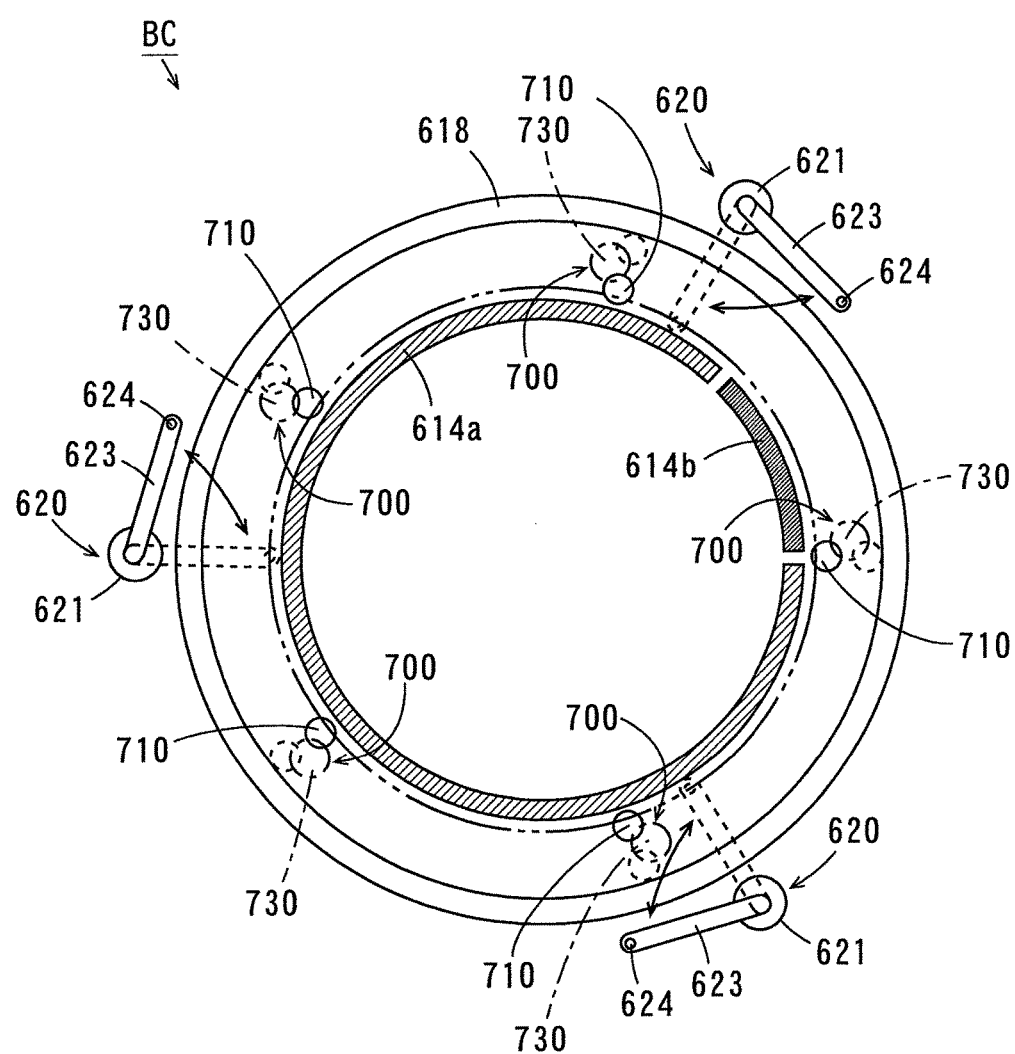
FIG. 6 is a schematic plan view showing the configuration of the back surface cleaning processing unit.

The back surface cleaning processing unit BC will be then described in detail with reference to the drawings. FIGS. 5 and 6 are a side view and a schematic plan view showing the configuration of the back surface cleaning processing unit BC, respectively. Parts of the constituent elements of the back surface cleaning processing unit BC are shown schematically in FIG. 6. The back surface cleaning processing unit BC includes a casing 900 having a substantially rectangular parallelepiped shape, and the following constituent elements are provided inside of the casing 900.

As shown in FIGS. 5 and 6, the back surface cleaning processing unit BC includes a spin chuck 600 that horizontally holds and rotates the substrate W. The spin chuck 600 includes a spin motor 200, a rotating shaft 210, a disc-shaped spin plate 520, a plate supporting member 510, an annular member 525, magnet plates 614a, 614b, and a plurality of substrate holding mechanisms 700.

The spin motor 200 is provided in the upper portion of the back surface cleaning processing unit BC. The spin motor 200 is supported by a motor supporting member 200s. A through hole 200h extending in the vertical direction is formed in the motor supporting member 200s. The motor supporting member 200s is attached to a motor fixing member 290. The motor fixing member 290 is fixed to the casing 900 of the back surface cleaning processing unit BC.

The rotating shaft 210 having a cylindrical shape is provided to extend downward from the inside of the spin motor 200. The rotating shaft 210 functions as an output shaft of the spin motor 200.

The plate supporting member 510 is attached to the lower end of the rotating shaft 210. As described below, the plate supporting member 510 has a cylindrical shape. The spin plate 520 is supported horizontally by the plate supporting member 510. The annular member 525 is attached to a lower surface 520u of the spin plate 520. The details of the spin plate 520 and the annular member 525 will be described below. The spin motor 200 rotates the rotating shaft 210 such that the plate supporting member 510, the spin plate 520 and the annular member 525 integrally rotate around a vertical axis. A circular opening 520o is formed at the center portion of the spin plate 520.

A fluid supply pipe 400 is inserted into the through hole 200h of the motor supporting member 200s, the inside of the rotating shaft 210 of the spin motor 200 and the inside of the plate supporting member 510. Cleaning liquid and gas can be supplied onto the substrate W held by the spin chuck 600 through the fluid supply pipe 400. The details of the configuration of the fluid supply pipe 400 and its peripheral members will be described below.

The plurality of (five in FIG. 6) substrate holding mechanisms 700 are spaced in a periphery of the spin plate 520 equiangularly about the rotating shaft 210. The number of the substrate holding mechanisms 700 is desirably not less than five. The reason for this will be described below.

Each substrate holding mechanism 700 is mainly composed of a holding pin 710, a supporter 720, a shaft 730 and a magnet 790. The spine plate 520 is provided with the supporter 720. The shaft 730 is supported to be rotatable inside of the supporter 720. The substantially columnar holding pin 710 is attached to the lower end of the shaft 730. The magnet 790 is attached to the upper end of the shaft 730.

Each substrate holding mechanism 700 is switchable between a closed state where the holding pin 710 abuts against the outer peripheral edge of the substrate W and an opened state where the holding pin 710 is spaced apart from the outer peripheral edge of the substrate W. Note that each substrate holding mechanism 700 enters the closed state when the N pole of the magnet 790 is on the inner side, while the substrate holding mechanism 700 enters the opened state when the S pole of the magnet 790 is on the inner side in this example. The supporters 720 and the magnets 790 are not shown in FIG. 6 in order to clarify the positional relationship between the holding pins 710 and the shafts 730 in the substrate holding mechanisms 700.

The magnet plates 614a, 614b are arranged above the spin plate 520 in the circumference direction with the rotating shaft 210 as its center. Each of the magnet plates 614a, 614b has the S pole and the N pole, respectively, on the outer side and the inner side. The magnet plates 614a, 614b are independently lifted and lowered, respectively, by magnet lifting/lowering mechanisms 617a, 617b and move between an upper position higher than the magnets 790 of the substrate holding mechanisms 700 and a lower position substantially equal in height to the magnets 790 of the substrate holding mechanisms 700.

Each substrate holding mechanism 700 is switchable between the opened state and the closed state by lifting and lowering the magnet plates 614a, 614b. The details of the operations of the magnet plates 614a, 614b and the substrate holding mechanism 700 will be described below.

A guard 618 for receiving the cleaning liquid scattered from the substrate W at the time of the back surface cleaning processing and dry processing of the substrate W is provided outside of the spin chuck 600. The guard 618 is shaped to be rotationally-symmetric with respect to the rotating shaft 210 of the spin chuck 600. Further, the guard 618 is lifted and lowered by a guard lifting/lowering mechanism 618a. The cleaning liquid received by the guard 618 is discharged or recovered by a liquid discharge device or a recovery device (not shown).

Outside of the guard 618, three or more (three in this example) substrate interface mechanisms 620 are equiangularly arranged with the rotating shaft 210 of the spin chuck 600 as a center. Each substrate interface mechanism 620 includes a lifting/lowering/rotating driver 621, a rotating shaft 622, an arm 623, and a holding pin 624. The rotating shaft 622 is provided to extend upward from the lifting/lowering/rotating driver 621, and the arm 623 is connected to extend in the horizontal direction from the upper end of the rotating shaft 622. The holding pin 624 for holding the outer peripheral edge of the substrate W is provided at the tip of the arm 623.

The lifting/lowering/rotating driver 621 causes the rotating shaft 622 to perform a lifting/lowering operation and a rotating operation. Thus, the holding pin 624 moves in the horizontal direction and the vertical direction.

Furthermore, as shown in FIG. 5, a cleaning brush 630 is arranged in the lower portion of the back surface cleaning processing unit BC. The cleaning brush 630 is attached to the upper end of the support shaft 635. The lower end of the support shaft 635 is attached on a brush holding member 631. The brush holding member 631 is driven by a brush moving mechanism 632, and therefore the cleaning brush 630 moves in the horizontal direction and the vertical direction.

A cleaning nozzle 633 is attached to a portion, in the vicinity of the cleaning brush 630, of the brush holding member 631. The cleaning nozzle 633 is connected to a cleaning liquid supplier 639 provided inside of the casing 900 through a cleaning liquid supply pipe (not shown). The cleaning liquid supplier 639 is connected to a cleaning liquid supply source in the factory. The cleaning liquid supplier 639 includes a control valve and so on and is controlled by the local controller LC (FIG. 4) provided in the interface block 15, for example.

A discharge port of the cleaning nozzle 633 is directed toward the periphery of the cleaning brush 630, and the cleaning liquid is discharged toward the periphery of the cleaning brush 630 from the discharge port. In this example, pure water is used as the cleaning liquid. In the following description, a constituent element composed of the cleaning brush 630, the support shaft 635 and the cleaning nozzle 633 is referred to as a cleaning mechanism 630M.

Inside of the casing 900, a cleaning mechanism waiting position 630P is set outside of the guard 618, at which the cleaning mechanism 630M waits while the back surface cleaning processing of the substrate W is not performed. A cleaning mechanism cover 271 is provided over the cleaning mechanism waiting position 630P so as to receive the pure water discharged from the cleaning nozzle 633 of the cleaning mechanism 630M waiting at the cleaning mechanism waiting position 630P. The cleaning mechanism cover 271 is attached to a cover fixing member 270. The cover fixing member 270 is attached to the casing 900 of the back surface cleaning processing unit BC. The details of the cleaning mechanism cover 271 will be described below.

A liquid drain 640 for draining the cleaning liquid received by the cleaning mechanism cover 271 to the outside of the substrate processing apparatus 500 is provided under the cleaning mechanism waiting position 630P. The liquid drain 640 is connected to the liquid drain equipment in the factory.

(4) One Example of Spin Chuck

FIGS. 7(a) and 7(b) are vertical cross sectional views showing one example of the spin chuck 600. In FIG. 7(a), the substrate W that is held while the spin plate 520 is not rotating is shown as well as the vertical cross sectional view of the spin chuck 600. On the other hand, in FIG. 7(b), the substrate W that is held while the spin plate 520 is rotating at the rotating speed of not lower than 600 rpm, for example, is shown as well as the vertical cross sectional view of the spin chuck 600.

First, the configuration of the annular member 525 will be described. As shown in FIG. 7(a), the annular member 525 of this example has a constant height 525H in the vertical direction. The upper end 525a of the annular member 525 is attached to the lower surface 520u of the spin plate 520. An inner peripheral surface 525b of the annular member 525 is continuously inclined such that an inner diameter of the annular member 525 becomes gradually larger from the upper end 525a towards a lower end 525c.

Figure 8:
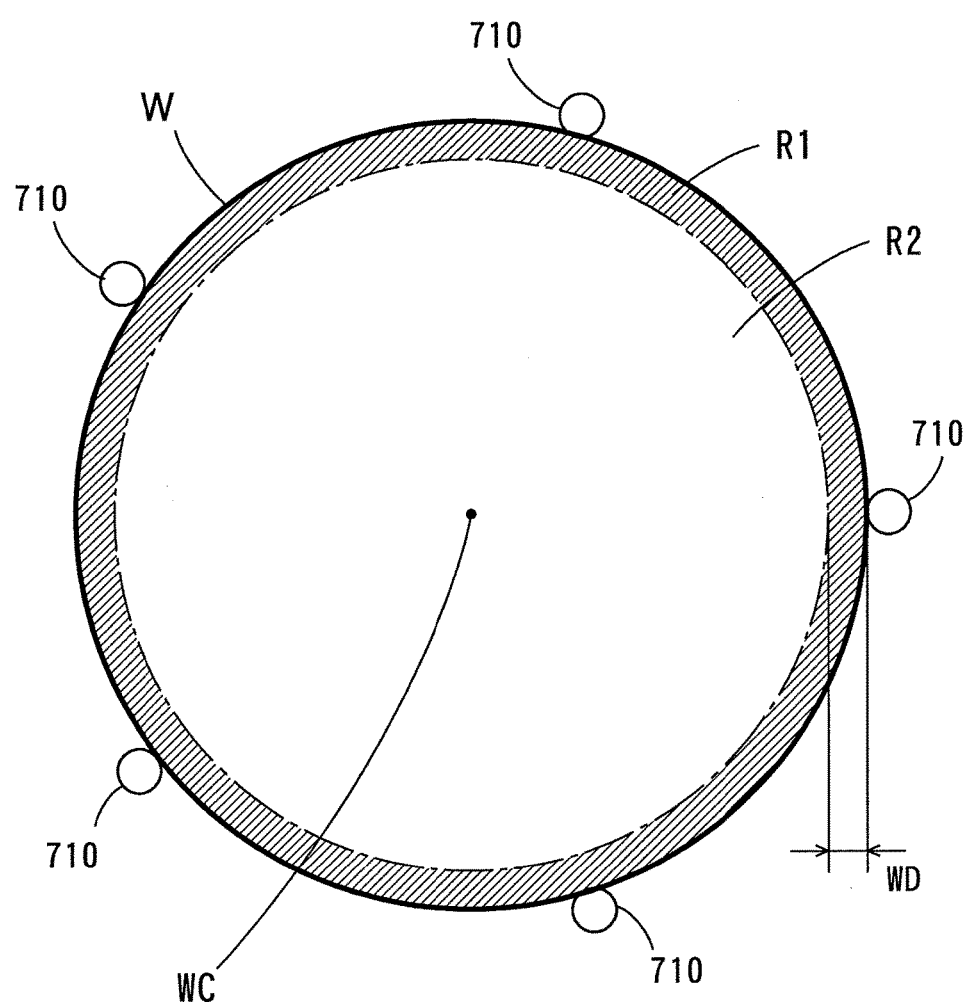
FIG. 8 is a plan view of the substrate of FIG. 7(a) viewed from a spin plate.

FIG. 8 is a plan view of the substrate W of FIG. 7(a) viewed from the spin plate 520. As shown in FIGS. 7(a) and 8, the lower end 525c of the annular member 525 is formed so as to be opposite to an annular region R1 that extends along a periphery in the upper surface of the substrate W held by the spin chuck 600. In this example, the annular region R1 is set in the region of a constant width WD from the outer peripheral edge in the upper surface of the substrate W.

When a diameter of the substrate W is 300 mm, the width WD is set to not less than 10 mm and not more than 15 mm, for example. The width WD may be set substantially equal to the width of the region in the periphery of the substrate W where chips are not formed.

Note that the annular region R1 only has to be positioned in the region of the constant width WD from the outer peripheral edge in the upper surface of the substrate W. For example, the annular region R1 may be set in a region of a predetermined width that is slightly spaced apart from the outer peripheral edge towards the center in the upper surface of the substrate W.

(5) Effects of Spin Plate and Annular Member of FIGS. 7(a) and 7(b)

(5-1) As described above, the annular member 525 is attached to the lower surface 520u of the spin plate 520 such that the lower end 525c of the annular member 525 is positioned under the spin plate 520. In this case, a distance G2 between the upper surface of the substrate W held by the spin chuck 600 and the lower surface 520u of the spin plate 520 is larger than a distance G1 between the upper surface of the substrate W and the lower end 525c of the annular member 525.

When the diameter of the substrate W is 300 mm, the height 525H of the annular member 525 is set such that the distance G1 is about 1 mm and the distance G2 is about 18 mm.

As shown in FIG. 7(b) and FIG. 8, when the spin chuck 600 that holds the substrate W rotates at the rotating speed that is not lower than 600 rpm, for example, the atmosphere over a region R2 inside of the annular region R1 of the upper surface of the substrate W (hereinafter referred to as a central region), flows out to the space of outside of the substrate W through the gap between the lower end 525c of the annular member 525 and the annular region R1 of the substrate W. Thus, the negative pressure is developed in the space over the central region R2 of the substrate W and therefore, the substrate W is bent such that the central region R2 comes closer to the lower surface 520u of the spin plate 520.

When the diameter of the substrate W is 300 mm and the spin chuck 600 rotates at the speed of not lower than 2000 rpm, the distance DE in the vertical direction between the upper surface position of the center WC of the substrate W and the upper surface position of the periphery of the substrate W is 1.5 mm, for example.

In the spin chuck 600 of this example, the distance G2 between the central region R2 of the substrate W and the lower surface 520u of the spin plate 520 is sufficiently larger than the distance G1 between the annular region R1 of the substrate W and the lower end 525c of the annular member 525, and therefore the central region R2 of the substrate W does not come in contact with the spin plate 520. On the other hand, the holding pins 710 abut against the outer peripheral edge such that the substrate W is held, and therefore the annular region R1 of the substrate W does not come in contact with the lower end 525c of the annular member 525.

Further, in the spin chuck 600 of this example, the distance G1 between the annular region R1 of the substrate W and the lower end 525c of the annular member 525 is set sufficiently smaller than the distance G2 between the central region R2 of the substrate W and the lower surface 520u of the spin plate 520. Thus, the atmosphere including a mist of the cleaning liquid, particles and the like is prevented from flowing into the space over the central region R2 of the substrate W from a gap between the annular region R1 of the substrate W and the lower end 525c of the annular member 525 at the time of the back surface cleaning processing and drying processing of the substrate W described below.

As a result, the damage to the substrate W caused by contact of the upper surface of the substrate W with the spin chuck 600 can be prevented, and the lower surface of the substrate W can be cleaned while the upper surface of the substrate is kept clean.

(5-2) In this example, the space above the upper surface of the substrate W held by the spin chuck 600 is covered by the spin plate 520 and the annular member 525. Here, the substrate holding mechanism 700 is provided at the spin plate 520. Therefore, it is not necessary to provide a separate configuration for rotating the substrate holding mechanism 700 together with the rotating shaft 210 in addition to the configuration for covering the space above the upper surface of the substrate W. Thus, an increase in the number of the members of the back surface cleaning processing unit BC is suppressed. Further, the configuration for covering the space above the upper surface of the substrate W can be easily fabricated by attaching the annular member 525 to the spin plate 520.

(5-3) As described above, the inner peripheral surface 525b of the annular member 525 of this example is continually inclined. In this case, the atmosphere above the central region R2 of the substrate W flows along the lower surface 520u of the spin plate 520 and the inner peripheral surface 525b of the annular member, and is smoothly led to the gap between the lower end 525c of the annular member 525 and the upper surface of the substrate W. As a result, the turbulence is not generated on the upper surface of the substrate W, and therefore the stability of the holding state of the substrate W by the spin chuck 600 is ensured and the resist film formed on the upper surface of the substrate W is prevented from being affected by the turbulence.

Note that the inner peripheral surface 525b of the annular member 525 may be formed in the stepped shape such that the inner diameter of the annular member 525 becomes gradually larger from the upper end 525a towards the lower end 525c. In this case, the effects similar to the above can be attained.

In the present embodiment, the inner peripheral surface 525b of the annular member 525 does not necessarily have to be formed such that the inner diameter of the annular member 525 becomes gradually larger from the upper end 525a towards the lower end 525c. In this case, the configuration of the annular member 525 is simplified.

(6) Details of Fluid Supply Pipe

Figure 9:
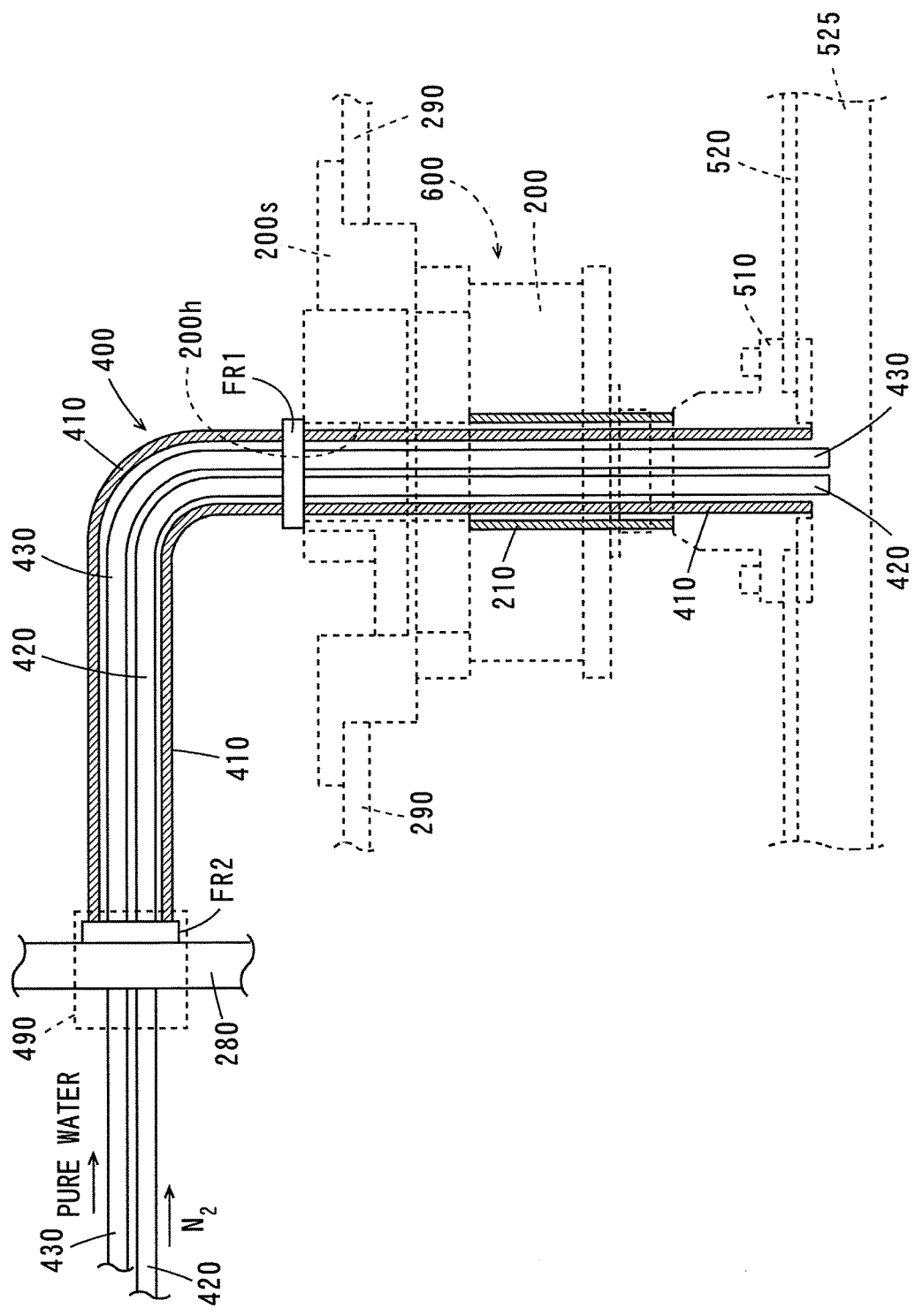
FIG. 9 is a vertical cross sectional view mainly showing the configuration of a fluid supply pipe of FIG. 5.
Figure 10:
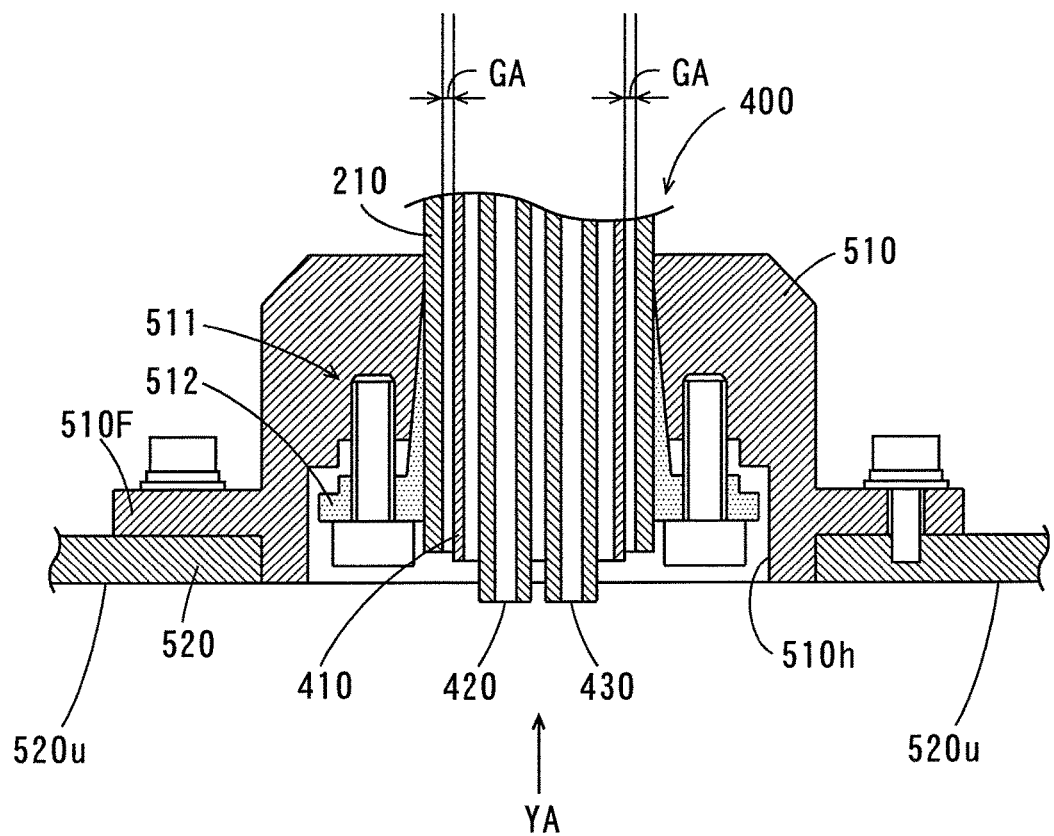
FIG. 10(a) is an enlarged vertical cross sectional view showing the configuration in the vicinity of a downstream end of the fluid supply pipe of FIG. 5.
FIG. 10(b) is a plan view of the downstream end of the fluid supply pipe viewed from the arrow YA of FIG. 10(a)
Figure 10:
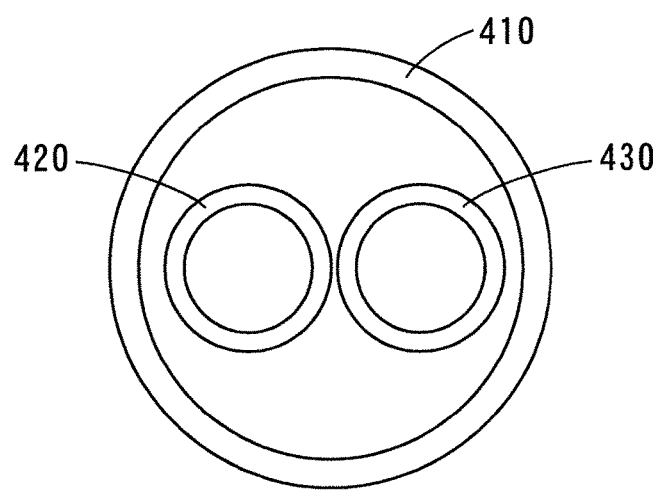

The details of the configuration of the fluid supply pipe 400 and its peripheral members of FIG. 5 will be described with reference to FIGS. 9 and 10. FIG. 9 is a vertical cross sectional view mainly showing the configuration of the fluid supply pipe 400 of FIG. 5. FIG. 10(a) is an enlarged vertical cross sectional view showing the configuration in the vicinity of the downstream end of the fluid supply pipe 400 of FIG. 5, and FIG. 10(b) is a plan view of the downstream end of the fluid supply pipe 400 viewed from the arrow YA of FIG. 10(a).

As described above, the fluid supply pipe 400 is inserted into the motor supporting member 200s, the spin motor 200, the rotating shaft 210 and the plate supporting member 510.

As shown in FIG. 9, the fluid supply pipe 400 is bent over the motor supporting member 200s and extends in the horizontal direction. In the following description, the end of the straight portion, extending in the vertical direction, of the pipe is referred to as a downstream end, and the end of the straight portion, extending in the horizontal direction, of the pipe is referred to as an upstream end.

In the fluid supply pipe 400, a first flange FR1 is integrally formed in the straight portion extending in the vertical direction. Further, a second flange FR2 is integrally formed at the upstream end.

The first flange FR1 is fixed to the motor supporting member 200s and the second flange FR2 is fixed to a pipe fixing member 280. The pipe fixing member 280 is attached to the casing 900 of the back surface cleaning processing unit BC. Therefore, the fluid supply pipe 400 is fixed to the casing 900 of the back surface cleaning processing unit BC by the pipe fixing member 280, the motor supporting member 200s and the motor fixing member 290.

As shown in FIGS. 10(a) and 10(b), the fluid supply pipe 400 has the configuration in which a gas supply pipe 420 and a liquid supply pipe 430 are contained in the guide pipe 410. The gas supply pipe 420 is used to supply gas (an $N_2$ gas in this example) to the substrate W. The liquid supply pipe 430 is used to supply liquid to the substrate W.

As shown in FIG. 10(a), the gas supply pipe 420 is provided such that the downstream end thereof projects slightly downward from the opening 520o of the spin plate 520. Thus, the $N_2$ gas can be reliably supplied to a space between the shield plate 525 and the substrate W. Similarly, the liquid supply pipe 430 is provided such that the downstream end thereof projects slightly downward from the opening 520o of the spin plate 520. Thus, the liquid can be reliably supplied to the space between the shield plate 525 and the substrate W.

The peripheral members at the downstream end of the fluid supply pipe 400 will be described. In this example, a gap GA is formed between the rotating shaft 210 and the guide pipe 410 while the fluid supply pipe 400 is being attached to the motor supporting member 200s and the pipe fixing member 280 of FIG. 9.

The plate supporting member 510 having a substantially cylindrical shape is attached to the rotating shaft 210 in the vicinity of the downstream end of the fluid supply pipe 400. The plate supporting member 510 has an inner peripheral surface 510h that has a diameter decreasing from the lower end towards the upper end in a stepped shape.

When the plate supporting member 510 is attached to the rotating shaft 210, a pad fixing piece 512 having a cylindrical shape is fitted in a gap between the inner peripheral surface 510h of the plate supporting member 510 and an outer peripheral surface of the rotating shaft 210, and the pad fixing piece 512 is screwed into a screw receiver 511 in the plate supporting member 510. This causes the plate supporting member 510 to be reliably fixed to the lower end of the rotating shaft 210.

A flange 510F is formed in the vicinity of the lower end of the plate supporting member 510. The flange 510F and the spin plate 520 are screwed into each other, so that the spin plate 520 is fixed to the rotating shaft 210.

As shown in FIG. 9, the second flange FR2 is formed at the upstream end of the fluid supply pipe 400. The second flange FR2 is fixed to the pipe fixing member 280. Further, a supply pipe fixing member 490 is provided in the vicinity of the upstream end of the fluid supply pipe 400. In the supply pipe fixing member 490, the gas supply pipe 420 and the liquid supply pipe 430 are fixed to the guide pipe 410.

The gas supply pipe 420 and the liquid supply pipe 430 extend from the upstream end of the guide pipe 410 to the outside, respectively. The upstream end of the gas supply pipe 420 extending from the upstream end of the guide pipe 410 is connected to a gas supply device (not shown). The $N_2$ gas is supplied to the gas supply pipe 420 from the gas supply device such that the $N_2$ gas is supplied to the substrate W. The upstream end of the liquid supply pipe 430 extending from the upstream end of the guide pipe 410 is connected to a liquid supply device (not shown). The liquid supply device supplies the liquid to the liquid supply pipe 430 such that the liquid is supplied to the upper surface of the substrate W. In the present embodiment, the liquid supply pipe 430 does not have to be provided.

(7) Operation for Holding Substrate

Figure 12:
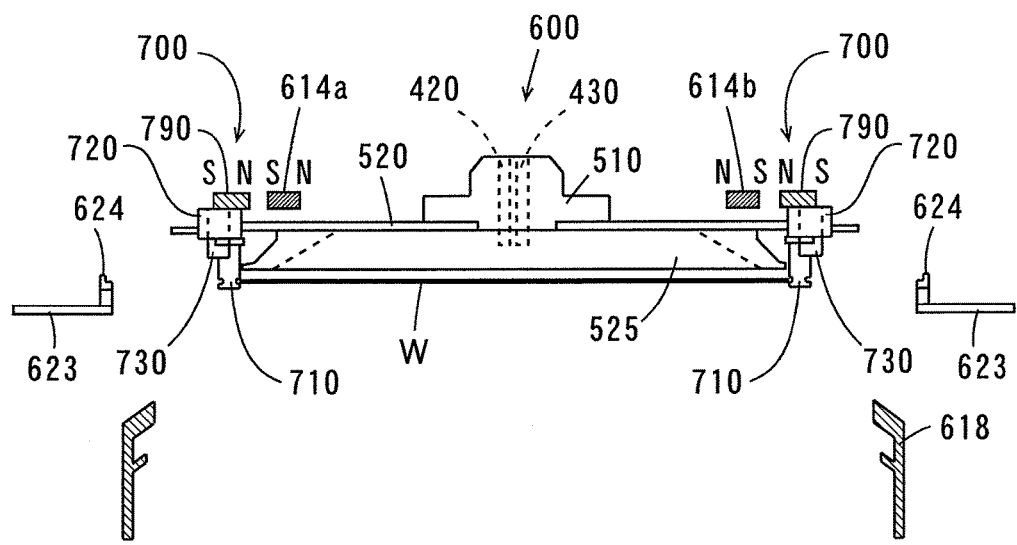
FIGS. 12(a) and 12(b) are diagrams for explaining the holding operation of the substrate by the spin chuck.
Figure 12:
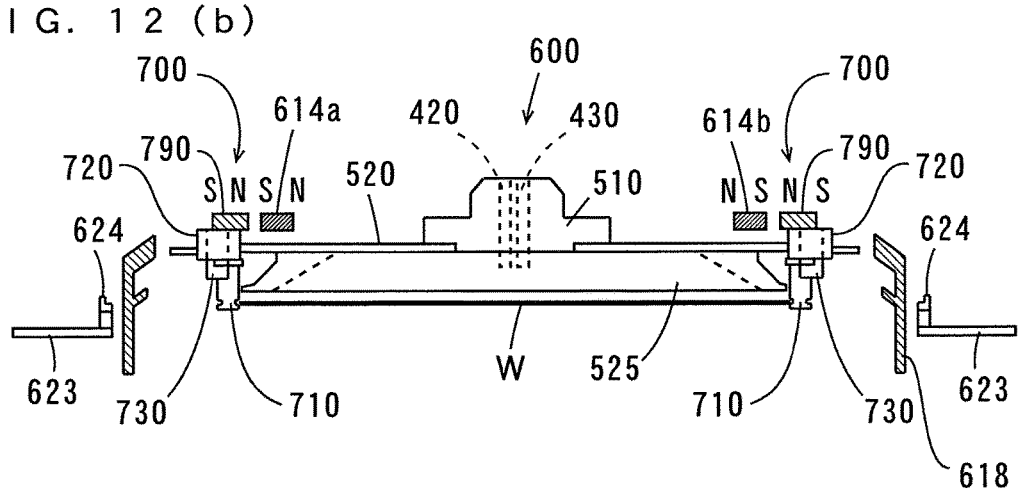

The operation for holding the substrate W by the spin chuck 600 will be described. FIGS. 11 and 12 are diagrams for explaining the operation for holding the substrate W by the spin chuck 600.

First, as shown in FIG. 11(a), the guard 618 moves to a position lower than the substrate holding mechanism 700. The plurality of the holding pins 624 of the plurality of substrate interface mechanisms 620 (FIG. 5) move to a position below the spin plate 520 through a position above the guard 618. The substrate W is placed on the plurality of holding pins 624 by the fourth central robot CR4 (FIG. 1).

At this time, the magnet plates 614a, 614b are at the upper position. In this case, a line of magnetic force B of the magnet plates 614a, 614b is directed outward from the inside at the height of the magnets 790 in the substrate holding mechanisms 700. Therefore, the S pole of the magnet 790 in each substrate holding mechanism 700 is sucked inward. This causes each substrate holding mechanism 700 to enter the opened state.

Then, the plurality of holding pins 624 rise with the substrate W held therein, as shown in FIG. 11(b). This causes the substrate W to move to a position among the holding pins 710 of the plurality of substrate holding mechanisms 700.

Then, as shown in FIG. 12(a), the magnet plates 614a, 614b move to the lower position. In this case, the N pole of the magnet 790 in each substrate holding mechanism 700 is sucked inward. This causes each substrate holding mechanism 700 to enter the closed state, causing the holding pin 710 in each substrate holding mechanism 700 to hold the outer peripheral edge of the substrate W. Note that each substrate holding mechanism 700 holds the outer peripheral edge of the substrate W between any two of the holding pins 624 that are adjacent to each other. Therefore, the substrate holding mechanisms 700 and the holding pins 624 do not interfere with each other. Thereafter, the plurality of holding pins 624 move outwardly from the guard 618.

Then, as shown in FIG. 12(b), the guard 618 moves to the height at which the substrate W held by the substrate holding mechanisms 700 is surrounded. The substrate W is subjected to the back surface cleaning processing.

(8) Back Surface Cleaning Processing

Figure 13:
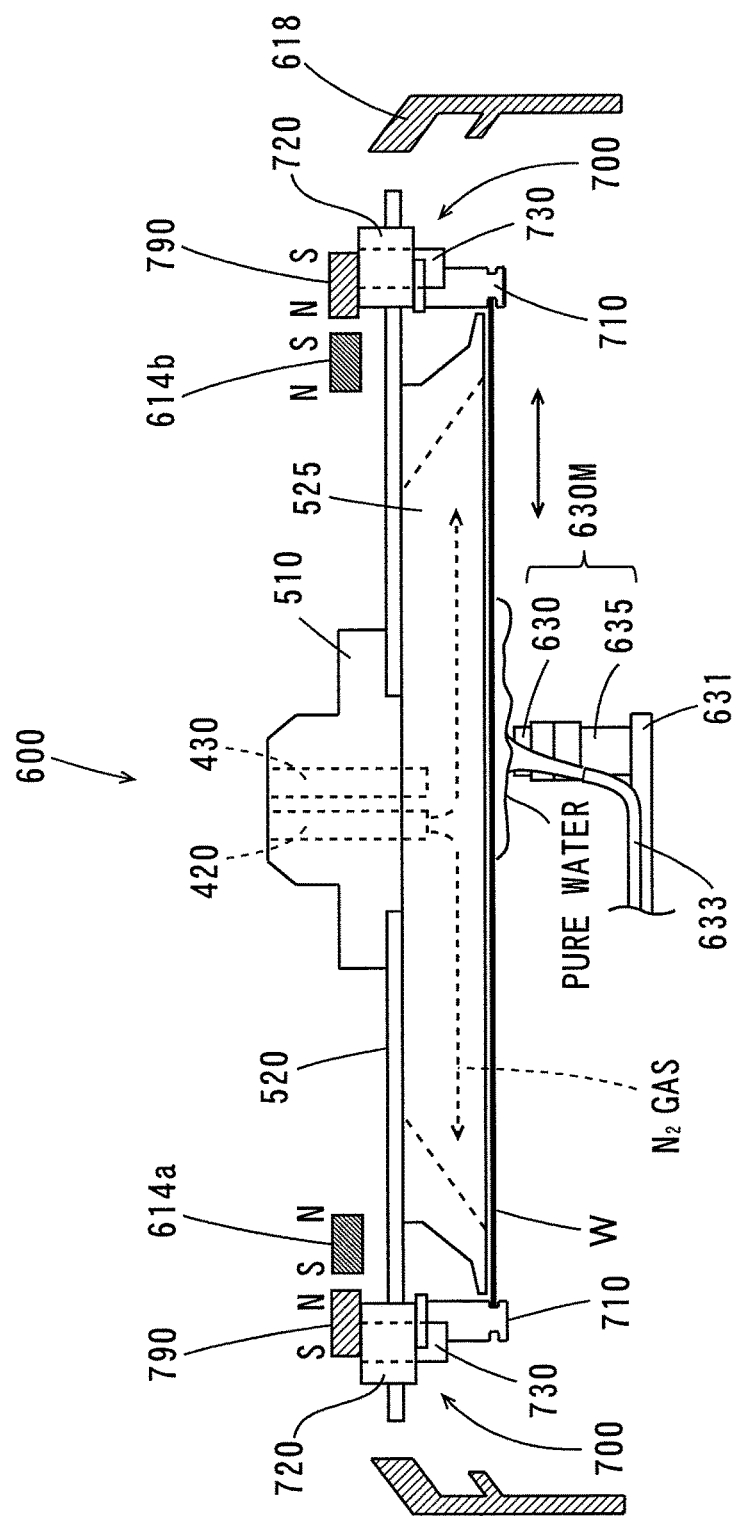
FIG. 13 is a side view for explaining back surface cleaning processing of the substrate.
Figure 14:
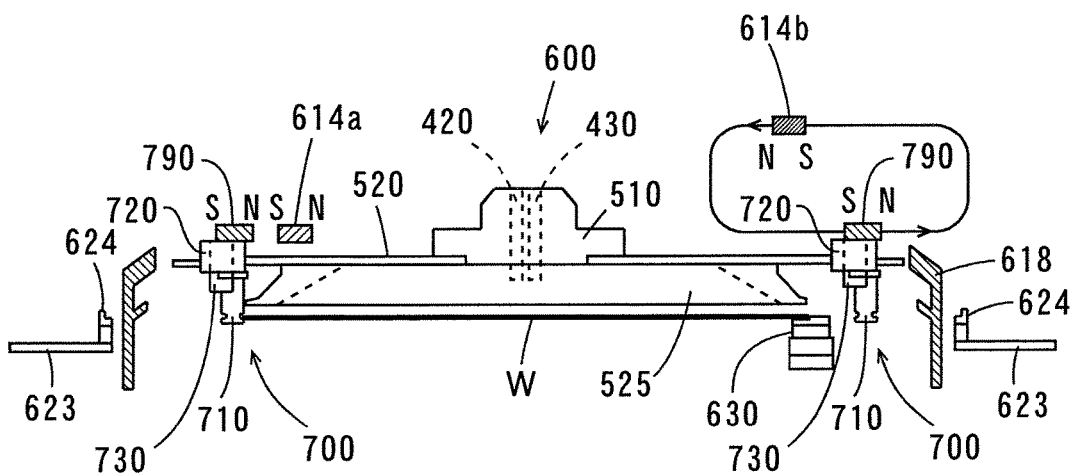
FIGS. 14(a) and 14(b) are side views for explaining the back surface cleaning processing of the substrate.
Figure 14:
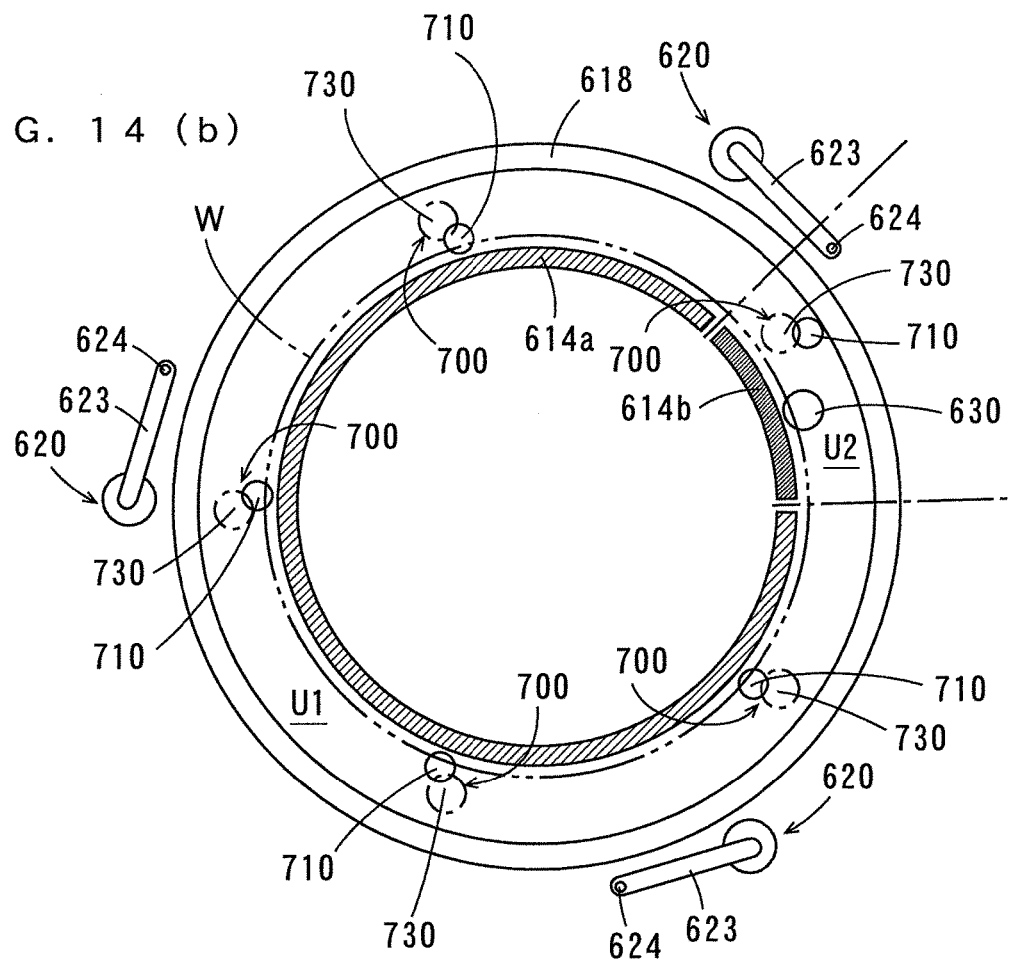

FIGS. 13 and 14 are side views for explaining the back surface cleaning processing of the substrate W.

As shown in FIG. 13, the spin chuck 600 causes the substrate W to rotate and the $N_2$ gas is supplied to the space between the shield plate 525 and the substrate W through the gas supply pipe 420 at the time of the back surface cleaning processing of the substrate W. Therefore, a flow of the $N_2$ gas from above the center of the substrate W towards the outside of the substrate W is formed between the shield plate 525 and the substrate W. Note that, in the back surface cleaning processing, the rotating speed of the substrate W held by the spin chuck 600 is set to about 600 rpm, for example.

In this state, the cleaning brush 630 comes in contact with the lower surface of the substrate W. Then, the cleaning brush 630 moves between a position above the center of the substrate W and a position below the periphery of the substrate and thus comes in contact with the entire lower surface of the substrate W. The pure water is supplied from the cleaning nozzle 633 to a contact portion between the substrate W and the cleaning brush 630. Thus, the entire lower surface of the substrate W is cleaned by the cleaning brush 630 and a contaminant that adheres to the lower surface of the substrate W is removed.

Next, as shown in FIG. 14(a), the magnet plate 614a is arranged at the lower position, and the magnet plate 614b is arranged at the upper position. In this case, as shown in FIGS. 14(a) and 14(b), each substrate holding mechanism 700 enters the closed state in a region U1 (FIG. 14(b)) outside of the magnet plate 614a, while each substrate holding mechanism 700 enters an opened state in a region U2 (FIG. 14(b)) outside of the magnet plate 614b. That is, the holding pin 710 in each substrate holding mechanism 700 is maintained in contact with the outer peripheral edge of the substrate W when passing through the region U1 outside of the magnet plate 614a, while the holding pin 710 is spaced apart from the outer peripheral edge of the substrate W when passing through the region U2 outside of the magnet plate 614b.

Therefore, in the region U2 outside of the magnet plate 614b, the lower surface portion of the outer peripheral edge of the substrate W can be cleaned by the cleaning brush 630.

Note that at least four of the five substrate holding mechanisms 700 are positioned in the region U1 outside of the magnet plate 614a in this example. In this case, even if the holding pin 710 of each substrate holding mechanism 700 is spaced apart from the outer peripheral edge of the substrate W when passing through the region U2 outside of the magnet plate 614b, the substrate is held by at least the four substrate holding mechanisms 700. Thus, the stability of the holding state of the substrate W is ensured.

After the completion of the back surface cleaning processing, the magnet plates 614a, 614b are arranged at the lower position and the substrate W is held by all of the substrate holding mechanisms 700. In this state, the spin chuck 600 causes the substrate W to rotate at even higher speed (about 2000 rpm to 2400 rpm, for example). This causes the pure water that adheres to the substrate W to be scattered, causing the substrate W to be dried (drying processing).

The back surface cleaning processing unit BC according to the present embodiment has the liquid supply pipe 430 provided to supply the liquid to the substrate W. Therefore, the liquid (pure water, for example) is supplied to the upper surface of the substrate W through the liquid supply pipe 430 at the time of the back surface cleaning processing whereby the lower and upper surfaces of the substrate W can be cleaned simultaneously.

(9) Another Example of Spin Chuck

Another example of the spin chuck 600 will be then described. FIGS. 15(a) and 15(b) are vertical cross sectional views showing another example of the configuration of the spin chuck 600. In FIG. 15(a), the substrate W that is held with the spin plate 520 not rotating is shown as well as the vertical cross sectional view of the spin chuck 600. In FIG. 15(b), on the other hand, the substrate W that is held with the spin plate 520 rotating at a high speed is shown as well as the vertical cross sectional view of the spin chuck 600.

As for the spin chuck 600 of this example, the difference from the spin chuck 600 of FIGS. 7(a) and 7(b) will be described below. As shown in FIG. 15(a), the spin chuck 600 of this example includes a cylindrical connection member 526, a disc-shaped inner shield member 527 and an annular outer shield member 528 instead of the annular member 525 of FIGS. 7(a) and 7(b).

An inner diameter of the connection member 526 is equal to an inner diameter of the opening 520o of the spin plate 520, and an outer diameter of the connection member 526 is sufficiently smaller than an outer diameter of the spin plate 520.

The upper end of the connection member 526 is attached to the lower surface of the spin plate 520 such that a central axis of the connection member 526 coincides with a central axis of the spin plate 520. Further, the inner shield member 527 is attached to the lower end of the connection member 526. An opening 527o having an equal inner diameter to the opening 520o of the spin plate 520 is formed at the center of the inner shield member 527.

Thus, in the state where the inner shield member 527 is connected to the lower surface of the spin plate 520 with the connection member 526 sandwiched therebetween, an inner space of the plate supporting member 510 communicates with the space under the inner shield member 527 through the opening 520o of the spin plate 520, the inside of the connection member 526 and the opening 527o of the inner shield member 527.

An outer diameter of the inner shield member 527 is larger than the outer diameter of the connection member 526 and smaller than the outer diameter of the substrate W held by the spin chuck 600.

The outer shield member 528 is attached to a periphery of the inner shield member 527 to extend downward from the inner shield member 527. Part of an inner peripheral surface 528b of the outer shield member 528 is continually inclined such that the inner diameter of the outer shield member 528 becomes gradually larger from the upper end towards the lower end.

The lower end of the outer shield member 528 is formed so as to be opposite to the annular region R1 that extends along the periphery in the upper surface of the substrate W held by the spin chuck 600.

(10) Effects of Inner Shield Member and Outer Shield Member of FIGS. 15(a) and 15(b)

(10-1) As described above, the outer shield member 528 is attached to the inner shield member 527 such that the lower end of the outer shield member 528 is positioned under the inner shield member 527. Therefore, a distance G3 between the central region R2 of the substrate W held by the spin chuck 600 and the lower surface 527u of the inner shield member 527 is larger than the distance G1 between the annular region R1 of the substrate W and the lower end of the outer shield member 528.

When the diameter of the substrate W is 300 mm, the height of the connection member 526, the thickness of the inner shield member 527 and the height of the outer shield member 528 are set such that the distance G1 is about 1 mm and the distance G3 is about 2.5 mm, for example.

Thus, in the spin chuck 600 of this example, the distance G3 between the central region R2 of the substrate W and the lower surface 527u of the inner shield member 527 is larger than the distance G1 between the annular region R1 of the substrate W and the lower end of the outer shield member 528, so that the central region R2 of the substrate W does not come in contact with the inner shield member 527. On the other hand, the holding pins 710 abuts against the outer peripheral edge such that the substrate W is held, and therefore the annular region R1 of the substrate W does not come in contact with the lower end of the outer shield member 528.

Further, in the spin chuck 600 of this example, the distance G1 between the annular region R1 of the substrate W and the lower end of the outer shield member 528 is set to be sufficiently smaller than the distance G3 between the central region R2 of the substrate W and the lower surface 527u of the inner shield member 527. Therefore, the atmosphere including the mist of the cleaning liquid, the particles and the like is prevented from flowing into the space over the central region R2 of the substrate W from the gap between the annular region R1 of the substrate W and the lower end of the outer shield member 528 at the time of the back surface cleaning processing and the drying processing of the substrate W.

As a result, also in this example, the damage to the substrate W caused by contact of the upper surface of the substrate W with the spin chuck 600 can be prevented, and the lower surface of the substrate W can be cleaned while the upper surface of the substrate W is kept clean.

(10-2) In this example, the inner shield member 527 is provided under the spin plate 520. Thus, a distance between the upper surface of the substrate W held by the spin chuck 600 and the inner shield member 527 can be made smaller than a distance between the upper surface of the substrate W and the spin plate 520. Further, the configuration for covering the space over the upper surface of the substrate W can be easily fabricated by attaching the outer shield member 528 to the inner shield member 527.

(10-3) As described above, part of the inner peripheral surface 528b of the outer shield member 528 is continually inclined. In this case, the atmosphere over the central region R2 of the substrate W flows along the lower surface 527u of the inner shield member 527 and the inner peripheral surface 528b of the outer shield member 528 and is smoothly led to the gap between the lower end of the outer shield member 528 and the upper surface of the substrate W. As a result, the turbulence is not generated on the upper surface of the substrate W, and therefore the stability of the holding state of the substrate W by the spin chuck 600 is ensured and the resist film formed on the upper surface of the substrate W is prevented from being affected by the turbulence.

The inner peripheral surface 528b of the outer shield member 528 may be formed in a stepped shape such that the inner diameter of the outer shield member 528 becomes gradually larger from the upper end towards the lower end. In this case also, the effects similar to the above can be attained.

Note that the inner peripheral surface 528b of the outer shield member 528 does not necessarily have to be formed such that the inner diameter of the outer shield member 528 becomes gradually larger from the upper end towards the lower end. In this case, the configuration of the outer shield member 528 is simplified.

(11) Details of Cleaning Brush

Figure 16:
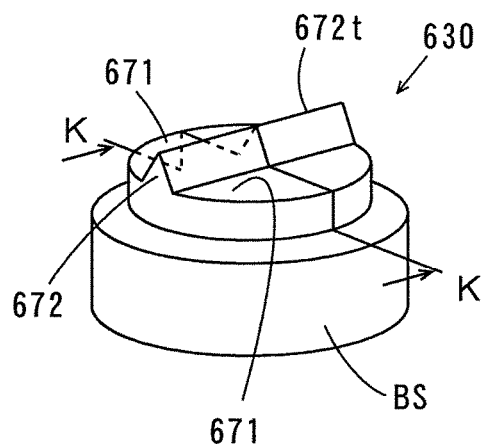
FIGS. 16(a) to 16(d) are diagrams for explaining the details of a cleaning brush of FIG. 5.
Figure 16:
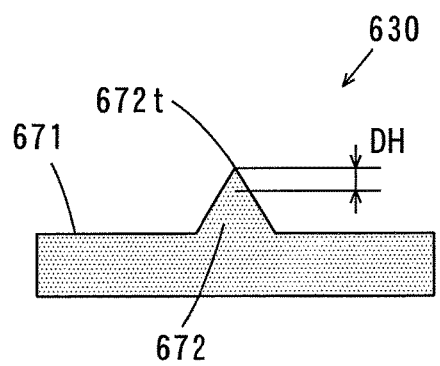
Figure 16:
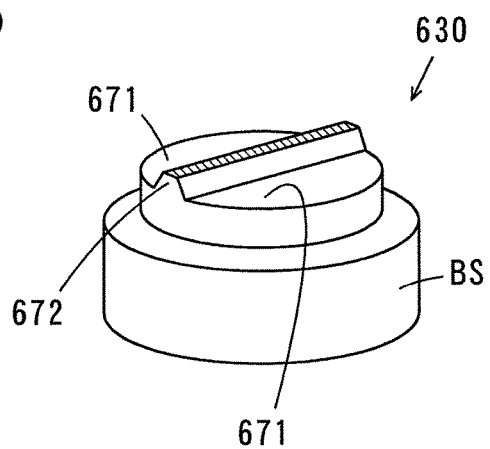
Figure 16:
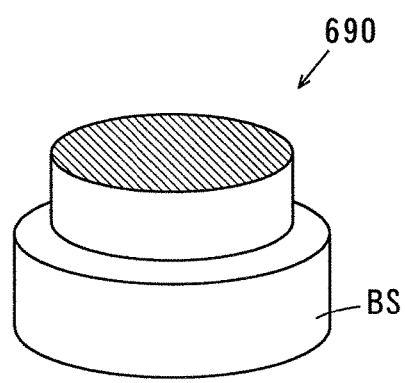

FIG. 16 is a diagram for explaining the details of the cleaning brush 630 of FIG. 5. FIG. 16(a) shows an external perspective view of the cleaning brush 630. As shown in FIG. 16(a), the cleaning brush 630 is attached on a columnar fixing member BS. The cleaning brush 630 has a circular upper surface 671 and a projection 672 that is projecting upward from the upper surface 671. The cleaning brush 630 abuts against the lower surface of the substrate W such that the lower surface of the substrate W is cleaned at the time of the back surface cleaning processing of the substrate W.

The projection 672 is formed so as to extend along a straight line that extends from one lateral side of the outer peripheral edge towards the other lateral side of the outer peripheral edge through the center of the upper surface 671 of the cleaning brush 630.

FIG. 16(b) shows a vertical cross sectional view of the cleaning brush 630 taken along the K-K line of FIG. 16(a). As shown in FIG. 16(b), the projection 672 has a horizontal cross sectional area that reduces gradually towards an upper end 672t. The cleaning brush 630 is a sponge brush made of polyvinyl alcohol, for example.

Prior to the back surface cleaning processing of the substrate W, a relative position of the cleaning brush 630 in the vertical direction with respect to the lower surface of the substrate W (hereinafter referred to as a cleaning position in the vertical direction) is set such that the upper end 672t of the projection 672 shrinks a predetermined height DH towards the lower end of the cleaning brush 630. The set cleaning position in the vertical direction is stored in the memory M (FIG. 4) in the local controller LC provided in the interface block 15. The operation of the brush moving mechanism 632 of FIG. 5 is controlled based on the cleaning position in the vertical direction stored in the memory M at the time of the back surface cleaning processing of the substrate W. The height DH is 1 mm, for example.

If the pressure exerted on the lower surface of the substrate W by the cleaning brush 630 is large at the time of the back surface cleaning processing of the substrate W, the substrate W held by the spin chuck 600 may be lifted up locally and the substrate W may be shifted or deformed. Further, if the pressure exerted on the lower surface of the substrate W by the cleaning brush 630 is large, the damage to the substrate W may occur because the cleaning brush 630 is pressed firmly against the substrate W. Therefore, the pressure exerted on the lower surface of the substrate W by the cleaning brush 630 is preferably as small as possible.

FIG. 16(c) shows an external perspective view of the cleaning brush 630 in the back surface cleaning processing, and FIG. 16(d) shows an external perspective view of a cleaning brush that does not have the projection 672 in the back surface cleaning processing. A contact surface with the substrate W in each of the cleaning brushes 630, 690 is indicated by hatching in FIGS. 16(c) and 16(d).

As shown in FIG. 16(c), an area of the contact surface with the substrate W in the cleaning brush 630 is smaller than an area of the contact surface with the substrate W in the cleaning brush 690. Therefore, when the height DH of FIG. 16(b) is constant, the pressure exerted on the lower surface of the substrate W by the cleaning brush 630 is smaller than the pressure exerted on the lower surface of the substrate W by the cleaning brush 690. Thus, the substrate W held by the spin chuck 600 is prevented from shifting or deforming at the time of the back surface cleaning processing of the substrate W. Further, because the cleaning brush 630 is prevented from pressing firmly against the substrate W, the damage to the substrate W is prevented.

As described above, the area of the contact surface with the substrate W in the cleaning brush 630 is smaller than the area of the contact surface with the substrate W in the cleaning brush 690. Therefore, the number of particles that adhere to the cleaning brush 630 at the time of the back surface cleaning processing of the substrate W can be made smaller than the number of the particles that adhere to the cleaning brush 690. Thus, the number of particles to be transferred from the cleaning brush 630 to the substrate W can be reduced.

Further, the friction force exerted between the cleaning brush 630 and the substrate W is smaller than the friction force exerted between the cleaning brush 690 and the substrate W at the time of the back surface cleaning processing of the substrate W. Therefore, the substrate W held by the spin chuck 600 is prevented from shifting against the holding force of the plurality of holding pins 710.

Polyvinyl alcohol is sufficiently flexible. Therefore, when the cleaning brush 630 made of the polyvinyl alcohol is used, the pressure exerted on the lower surface of the substrate W by the cleaning brush 630 can be made sufficiently smaller. Flexible material such as polyurethane or nylon other than the polyvinyl alcohol can be used as the material for the cleaning brush 630.

(12) Cleaning Mechanism Cover

FIG. 17(a) is a schematic plan view of the inside of the casing 900 mainly showing the spin chuck 600 and the cleaning mechanism 630M, and FIG. 17(b) is a side view for explaining the operation of the cleaning mechanism cover 271 of FIG. 5. Note that the cover fixing member 270 of FIG. 5 and FIG. 17(a) is indicated by the dotted line in FIG. 17(b). Further, FIG. 17(b) shows a block diagram of the configuration of the local controller LC of FIG. 4 and the cleaning liquid supplier 639 of FIG. 5 in addition to a side view of the cover fixing member 270, the cleaning mechanism cover 271 and the cleaning mechanism 630M.

As indicated by the dot-dash line in FIG. 17(a), the cleaning mechanism 630M enters a standby state at the predetermined cleaning mechanism waiting position 630P in proximity to one sidewall in the casing 900 while the back surface cleaning processing of the substrate W is not performed.

The brush moving mechanism 632 drives the brush holding member 631. Therefore, as indicated by the thick solid line in FIG. 17(a), the cleaning mechanism 630M moves under the substrate W held by the spin chuck 600 towards the center of the substrate W.

Then, the cleaning brush 630 abuts against the lower surface of the substrate W and the back surface cleaning processing of the substrate W is started. Thereafter, the cleaning mechanism 630M moves from the center towards the outer peripheral edge of the substrate W. While the cleaning brush 630 is in contact with the lower surface of the substrate W, the cleaning liquid (pure water in this example) is discharged from the cleaning nozzle 633 towards the lower surface of the substrate W. Thus, the lower surface of the substrate W is cleaned.

Next, when the cleaning mechanism 630M reaches the outer peripheral edge of the substrate W, discharge of the cleaning liquid from the cleaning nozzle 633 is stopped and the cleaning mechanism 630M moves to the cleaning mechanism waiting position 630P. Thereafter, the cleaning mechanism 630M reenters the waiting state at the cleaning mechanism waiting position 630P until the next back surface cleaning processing of the substrate W is started.

As shown in FIG. 17(b), the cleaning mechanism cover 271 is arranged at a position over the cleaning mechanism waiting position 630P. As described above, the cleaning mechanism cover 271 is provided over the cleaning mechanism waiting position 630P so as to receive the pure water that is discharged from the cleaning nozzle 633 of the cleaning mechanism 630M waiting at the cleaning mechanism waiting position 630P. Thus, when the cleaning liquid is discharged from the cleaning nozzle 633 of the cleaning mechanism 630M at the cleaning mechanism waiting position 630P, the discharged cleaning liquid is received by the cleaning mechanism cover 271 and is led to the liquid drain 640 of FIG. 5.

As shown in FIGS. 5 and 17(b), the tip end of the cleaning nozzle 633 is held upward in the cleaning mechanism 630M. Therefore, part of the cleaning liquid used in the previous back surface cleaning processing remains inside of the cleaning nozzle 633 while the back surface cleaning processing of the substrate W is not performed.

When the substrate processing apparatus 500 is stopped for a long period of time (3 days or more, for example), bacteria may be generated in the remaining cleaning liquid in the cleaning nozzle 633. In the present embodiment, the local controller LC (FIG. 4) provided in the interface block 15 controls the cleaning liquid supplier 639, whereby the cleaning liquid is discharged from the cleaning nozzle 633 at the cleaning mechanism waiting position 630P every given period of time (24 hours, for example) during the time between the completion of the back surface cleaning processing and the beginning of the next back surface cleaning processing.

In this case, even if the substrate cleaning apparatus 500 is stopped for a long period of time, the remaining cleaning liquid in the cleaning nozzle 633 is replaced with a new cleaning liquid every given period of time. As a result, generation of bacteria in the cleaning nozzle 633 is prevented.

The timing at which the cleaning liquid is discharged from the cleaning nozzle 633 at the cleaning mechanism waiting position 630P is not limited to the example described above. For example, the cleaning liquid may be discharged from the cleaning nozzle 633 at the cleaning mechanism waiting position 630P immediately before the back surface cleaning processing of the substrate W is started. In this case, the remaining cleaning liquid in the cleaning nozzle 633 is replaced with the new cleaning liquid immediately before the back surface cleaning processing is started. Thus, the clean cleaning liquid can be supplied to the lower surface of the substrate W at the start of the back surface cleaning processing.

While the cleaning liquid supplier 639 is provided inside of the casing 900 of the back surface cleaning processing unit BC in this example, the invention is not limited to this. The cleaning liquid supplier 639 may be provided outside of the back surface cleaning processing unit BC.

While the local controller LC (FIG. 4) provided in the interface block 15 controls the cleaning liquid supplier 639 in this example, the invention is not limited to this. The main controller 30 of FIG. 1 may control the cleaning liquid supplier 639 instead of the local controller LC.

(13) Other Embodiments (13-1) While the fluid supply pipe 400 has the configuration in which the gas supply pipe 420 and the liquid supply pipe 430 are contained in the guide pipe 410 in the embodiment described above, the invention is not limited to this. When it is not necessary to supply the cleaning liquid to the upper surface of the substrate W at the time of the back surface cleaning processing, only the gas supply pipe 420 may be contained inside of the guide pipe 410. Further, when only the cleaning liquid is supplied to the upper surface of the substrate W, only the liquid supply pipe 430 may be contained in the guide pipe 410.

(13-2) In the back surface cleaning processing unit BC, the lower surface and the outer peripheral edge of the substrate W do not necessarily have to be cleaned by the cleaning brush 630. In the back surface cleaning processing unit BC, the lower surface of the substrate W does not have to come in contact with the cleaning brush 630 but the back surface cleaning processing may be performed by supplying the cleaning liquid such as the pure water to the entire lower surface of the substrate W.

(13-3) While the back surface cleaning processing unit BC is arranged in the interface block 15 in the embodiment described above, the back surface cleaning processing unit BC may be arranged in any of the anti-reflection film processing block 10, the resist film processing block 11 and the development processing block 12 of FIG. 1. Alternatively, the back surface cleaning processing block including the back surface cleaning processing unit BC may be provided between the development processing block 12 and the interface block 15 of FIG. 1.

(13-4) In the exposure device 16 described above, the exposure processing may be performed on the substrate W using an immersion method, or the exposure processing may be performed on the substrate W using another method. In those cases, the processing defect caused by the contamination on the main surface of the substrate W and the back surface of the substrate W is prevented.

(13-5) While the back surface cleaning processing unit BC cleans the lower surface of the substrate W after the formation of the resist film and before the exposure processing by the exposure device 16 in the embodiment described above, the invention is not limited to this. The back surface cleaning processing unit BC may clean the lower surface of the substrate W after the formation of the resist film and after the exposure processing by the exposure device 16.

(13-6) The back surface cleaning processing unit BC can also be used as a chemical solution cleaning device that cleans the substrate using chemical solution. The chemical solution is, e.g., a solution such as BHF (buffered hydrofluoric acid), DHF (dilute hydrofluoric acid), hydrofluoric acid, hydrochloric acid, sulfuric acid, nitric acid, phosphoric acid, acetic acid, oxalic acid, a hydrogen peroxide solution, or a water solution such as ammonia water, or their mixed solutions. Rinse liquid is, e.g., pure water, carbonated water, ozone water, magnetic water, regenerated water (hydrogen water), or ionic water, or an organic solvent such as IPA (isopropyl alcohol).

(13-7) In the back surface cleaning processing unit BC, a motor for rotating the cleaning brush 630 around the vertical axis may be attached instead of the support shaft 635 that supports the cleaning brush 630. In this case, the rotating cleaning brush 630 abuts against the lower surface of the substrate W at the time of back surface cleaning processing of the substrate W such that the lower surface of the substrate W can be cleaned efficiently.

(13-8) While the above mentioned example describes the case where the back surface cleaning processing unit BC is provided in the substrate processing apparatus 500, the invention is not limited to this. The back surface cleaning processing unit BC may be provided in another substrate processing apparatus or alternatively, the back surface cleaning processing units BC may be used alone.

(14) Correspondences Between Constituent Elements in Claims and Parts in Preferred Embodiments In the following paragraphs, non-limiting examples of correspondences between various elements recited in the claims below and those described above with respect to various preferred embodiments of the present invention are explained.

In the embodiments described above, the substrate W is an example of a substrate, the back surface cleaning processing unit BC is an example of a substrate cleaning apparatus, the rotating shaft 210 and the plate supporting member 510 are examples of a rotating member, the spin motor 200 is an example of a rotation-driving device and the holding pins 710 of the substrate holding mechanism 700 is an example of a holding member.

Figure 15:
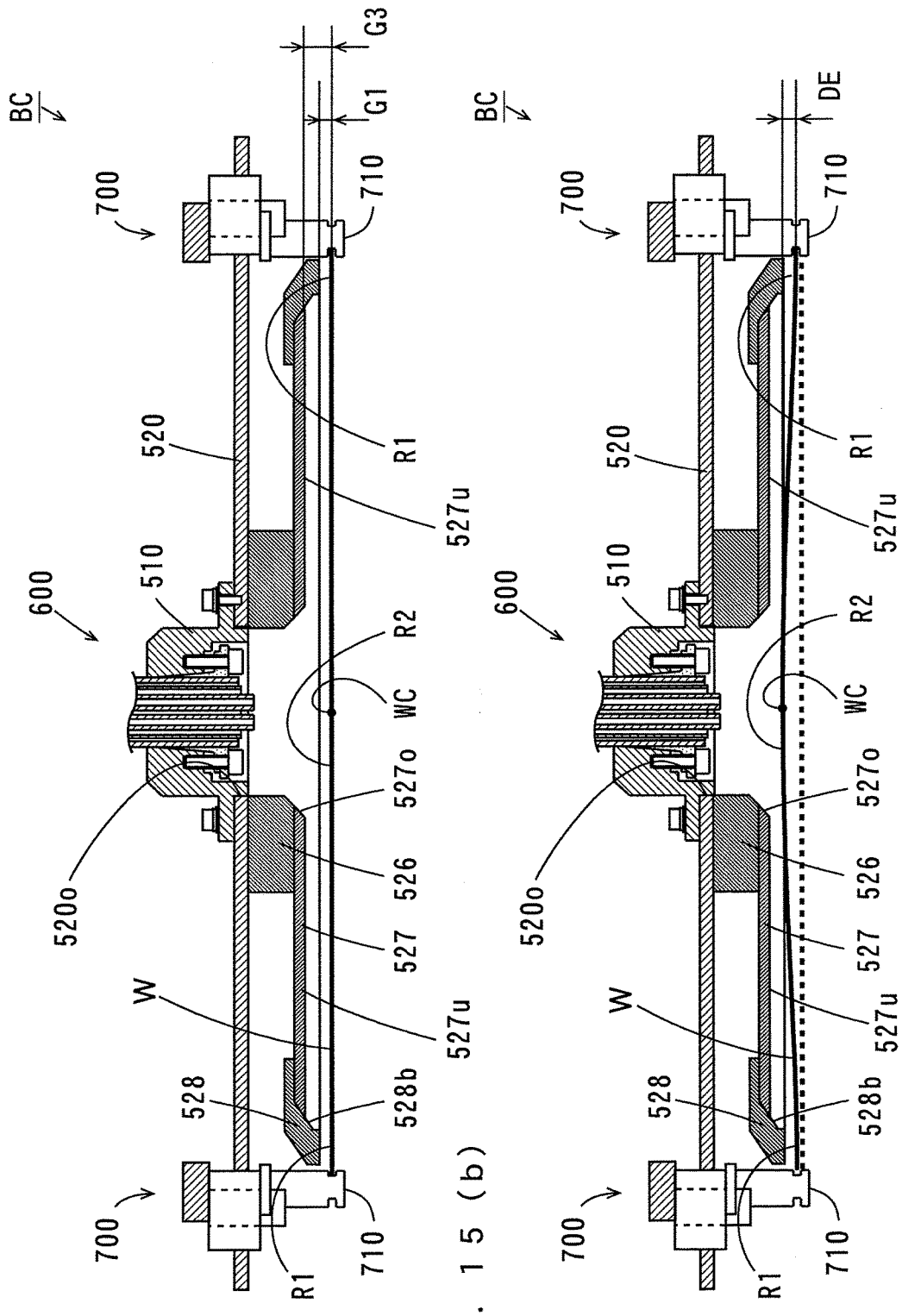
FIGS. 15(a) and 15(b) are vertical cross sectional views showing another example of the configuration of the spin chuck.

Further, the opening 520o of FIG. 7 and the opening 527o of FIG. 15 are examples of an opening, the spin plate 520 and the annular member 525 of FIG. 7, the inner shield member 527 and the outer shield member 528 of FIG. 15 are examples of a shield member, the fluid supply pipe 400 is an example of a fluid supply mechanism and the cleaning mechanism 630M is an example of a cleaning mechanism.

Further, the lower surface 520u of FIG. 7 and the lower surface 527u of FIG. 15 are examples of an opposite lower surface, the annular region R1 is an example of an annular region, the lower end 525c of FIG. 7 and the lower end of the outer shield member 528 of FIG. 15 are examples of a lower end, the distance G2 of FIG. 7 and the distance G3 of FIG. 15 are examples of a distance between the upper surface of the substrate and the opposite lower surface and the distance G1 of FIGS. 7 and 15 is an example of a distance between the upper surface and the lower end of the shield member.

Further, the spin plate 520 is an example of a first member and a supporting member, the annular member 525 is an example of a second member, the upper end 525a of the annular member 525 is an example of an upper end, the inner peripheral surface 525b of the annular member 525 is an example of an inner peripheral surface of the second member, the inner shield member 527 is an example of a third member, the outer shield member 528 is an example of a fourth member, the upper end of the outer shield member 528 is an example of an upper end of the fourth member and the inner peripheral surface 528b of the outer shield member 528 is an example of an inner peripheral surface of the fourth member.

Further, the cleaning brush 630 is an example of a brush, the projection 672 of the cleaning brush 630 is an example of a projection of the brush, the cleaning nozzle 633 is an example of a cleaning liquid discharge nozzle, the cleaning mechanism waiting position 630P is an example of a waiting position, the brush moving mechanism 632 is an example of a cleaning mechanism moving device and the cleaning mechanism cover 271 is an example of a liquid receiving member.

Furthermore, the exposure device 16 is an example of an exposure device, the substrate processing apparatus 500 is an example of a substrate processing apparatus, the anti-reflection film processing block 10, the resist film processing block 11 and the development processing block 12 are examples of a processing section, the interface block 15 is an example of an interface section, the resist film is an example of a photosensitive film, the coating unit RES provided in the resist film processing block 11 is an example of a photosensitive film formation unit.

While preferred embodiments of the present invention have been described above, it is to be understood that variations and modifications will be apparent to those skilled in the art without departing the scope and spirit of the present invention. The scope of the present invention, therefore, is to be determined solely by the following claims.

I claim:

1. A substrate cleaning apparatus that cleans a lower surface of a substrate, comprising:
   a rotating member that is provided to be rotatable around a rotation axis extending in a vertical direction;
   a rotation-driving device that rotates said rotating member;
   a plurality of holding members located at a periphery of the rotating member are configured to be rotatable together with said rotating member and hold the substrate by abutting against an outer peripheral edge of the substrate at a position below said rotating member;
   a shield member that is provided at said rotating member so as to cover a space above an upper surface of the substrate held by said holding members and has an opening at a position in which said rotation axis is included;
   a fluid supply pipe that supplies a fluid through said opening to the upper surface of the substrate held by said holding members; and
   a cleaning mechanism that cleans the lower surface of the substrate held by said holding members; wherein
   said shield member has
   an opposite lower surface that is opposite to the upper surface of the substrate held by said holding members around said opening, and
   an annular lowermost end that is formed around said opposite lower surface so as to be opposite to an annular region extending along a periphery in the upper surface of the substrate held by said holding members, and
   a distance between the upper surface of the substrate held by said holding members and said opposite lower surface is larger than a distance between the upper surface of the substrate held by said holding members and said lowermost end of said shield member,
   the fluid supply pipe has a lower end having a discharge port that discharges the fluid, a distance between the upper surface of the substrate held by the holding members and the lower end of the fluid supply pipe is larger than the distance between the upper surface of the substrate held by the holding members and the lowermost end of the shield member,
   the lowermost end of the shield member is positioned above the upper surface of the substrate held by the holding members, and
   a gap is formed between the lowermost end of the shield member and the upper surface of the substrate held by the holding members.

2. The substrate cleaning apparatus according to claim 1, wherein
   said shield member includes
   a first member that is provided at said rotating member and has said opposite lower surface and said opening, and
   an annular second member that has said lowermost end of said shield member, wherein
   said second member is provided at said first member such that said lowermost end of said shield member is positioned under said first member, and
   said holding members are provided at said first member.

3. The substrate cleaning apparatus according to claim 2, wherein
   said second member further has an upper end that is attached to said first member, and
   an inner peripheral surface of said second member is inclined such that an inner diameter of said second member gradually increases from said upper end towards said lowermost end of said shield member.

4. The substrate cleaning apparatus according to claim 1, further comprising a supporting member that is attached to said rotating member to support said holding members, wherein
   said shield member includes
   a third member that is provided under said supporting member and has said opposite lower surface and said opening, and
   an annular fourth member that has said lowermost end of said shield member, and
   said fourth member is provided at said third member such that said lowermost end of said shield member is positioned under said third member.

5. The substrate cleaning apparatus according to claim 4, wherein
   said fourth member further has an upper end attached to said third member, and
   an inner peripheral surface of said fourth member is inclined such that an inner diameter of said fourth member gradually increases from said upper end towards said lowermost end of said shield member.

6. The substrate cleaning apparatus according to claim 1, wherein
said cleaning mechanism includes a brush that cleans the lower surface of the substrate held by said holding members,
a projection abuttable against the lower surface of the substrate is formed on said brush, and
a horizontal cross sectional area of said projection reduces gradually towards an upper end of the brush.

7. The substrate cleaning apparatus according to claim 1, wherein said cleaning mechanism includes a cleaning liquid discharge nozzle that discharges cleaning liquid from below towards the lower surface of the substrate held by said holding members,
the substrate cleaning apparatus further comprising:
a cleaning mechanism moving device that moves said cleaning mechanism between a position that is opposite to the lower surface of the substrate and a predetermined waiting position that is not opposite to the lower surface of the substrate, and
a liquid receiving member that is provided over said waiting position and configured to receive the cleaning liquid discharged from said cleaning liquid discharge nozzle of said cleaning mechanism when said cleaning mechanism is at said waiting position.

8. A substrate processing apparatus that is arranged adjacent to an exposure device and performs processing on a substrate, comprising:
a processing section for performing the processing on the substrate; and
an interface section for receiving and transferring the substrate between said processing section and said exposure device, wherein
at least one of said processing section and said interface section includes the substrate cleaning apparatus according to claim 1 that cleans the lower surface of the substrate.

9. The substrate cleaning apparatus according to claim 8, wherein
said processing section includes a photosensitive film formation unit configured to form a photosensitive film made of a photosensitive material on an upper surface of the substrate, and
said substrate cleaning apparatus is configured to clean the lower surface of the substrate after the formation of the photosensitive film by said photosensitive film formation unit and before or after the exposure processing by said exposure device.

* * * * *